United States Patent [19]

Miyake

[11] Patent Number: 5,732,334
[45] Date of Patent: Mar. 24, 1998

[54] RADIO TRANSMITTER AND METHOD OF CONTROLLING TRANSMISSION BY RADIO TRANSMITTER

[75] Inventor: Atsushi Miyake, Tokyo, Japan

[73] Assignee: Mitsubishi Denki Kabushiki Kaisha, Tokyo, Japan

[21] Appl. No.: 759,685

[22] Filed: Dec. 6, 1996

[30] Foreign Application Priority Data

Jul. 4, 1996 [JP] Japan ................... 8-174554

[51] Int. Cl.$^6$ ................... H04B 1/04
[52] U.S. Cl. .............. 455/126; 455/127; 330/129; 330/279
[58] Field of Search ................... 455/126, 127, 455/115, 117, 116, 232.1, 234.1, 234, 2, 236.1, 237.1, 239.1, 240.1–250.1, 251.1; 330/129, 141, 281, 285, 279; 375/345

[56] References Cited

U.S. PATENT DOCUMENTS

| | | | |
|---|---|---|---|
| 4,546,326 | 10/1985 | Van Uffelen et al. | 330/279 |
| 5,179,353 | 1/1993 | Miyake | 330/279 |
| 5,193,223 | 3/1993 | Walczak et al. | |
| 5,323,329 | 6/1994 | Keane | 455/126 |
| 5,656,972 | 8/1997 | Norimatsu | 330/279 |

*Primary Examiner*—Reinhard J. Eisenzopf
*Assistant Examiner*—Doris To
*Attorney, Agent, or Firm*—Rothwell, Figg, Ernst & Kurz

[57] ABSTRACT

APC circuitry used for a radio transmitter comprises a detector (7) which detects a radio frequency (RF) output signal (5) to output a detection signal (8), an integrator (15) which integrates the detection signal (8) to output a power signal (16) representing the average power level of the RF output signal (5), a control unit (18) for calculating an error level from the difference between the average power level and a reference power level which corresponds to a predetermined power of the RF output signal (5), and for multiplying the error level by a correction coefficient so as to calculate a control signal correction value for correcting the value of a control signal (14) and then generate control data the digital value of which is corrected according to the control signal correction value and a reference control value that is predetermined so as to generate the RF output signal (5) having the predetermined power.

15 Claims, 17 Drawing Sheets

FIG. 8

| SYSTEM MODE / CHANNEL BAND / TRANS-MISSION POWER LEVEL | ANALOG MODE | | | DIGITAL MODE | | |
|---|---|---|---|---|---|---|
| | L | M | H | L | M | H |
| POWER LEVEL 1 | DATA(A1L) | DATA(A1M) | DATA(A1H) | DATA(D1L) | DATA(D1M) | DATA(D1H) |
| POWER LEVEL 2 | DATA(A2L) | DATA(A2M) | DATA(A2H) | DATA(D2L) | DATA(D2M) | DATA(D2H) |
| ---- | ---- | ---- | ---- | ---- | ---- | ---- |
| POWER LEVEL n | DATA(AnL) | DATA(AnM) | DATA(AnH) | DATA(DnL) | DATA(DnM) | DATA(DnH) |

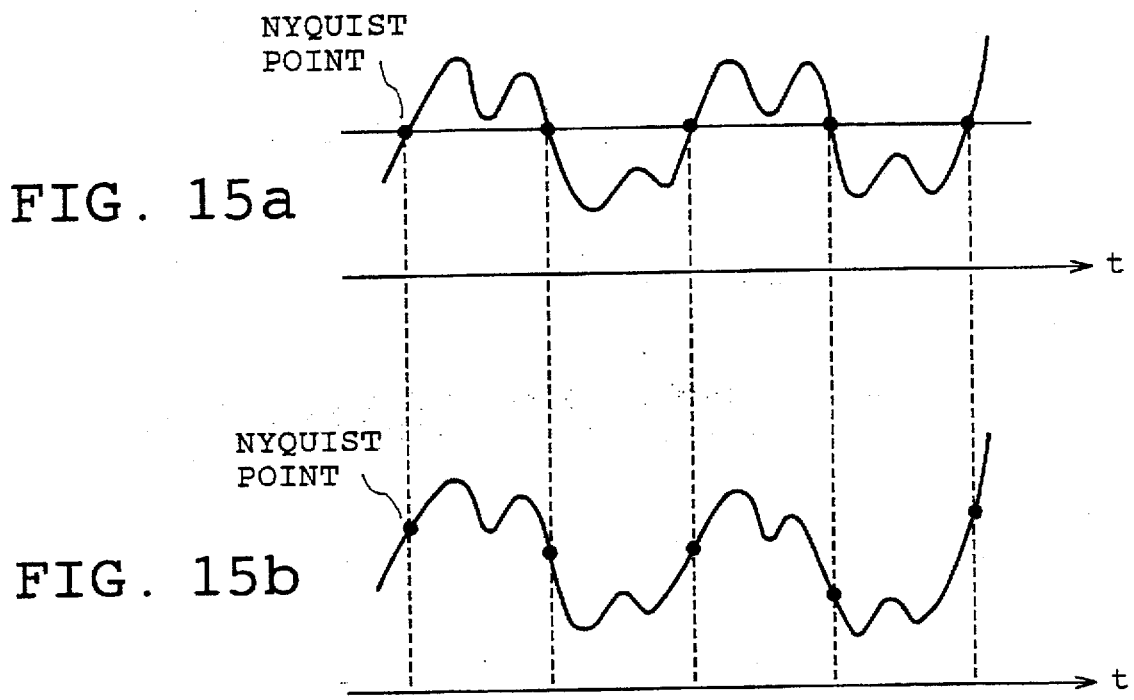
FIG. 15a
FIG. 15b
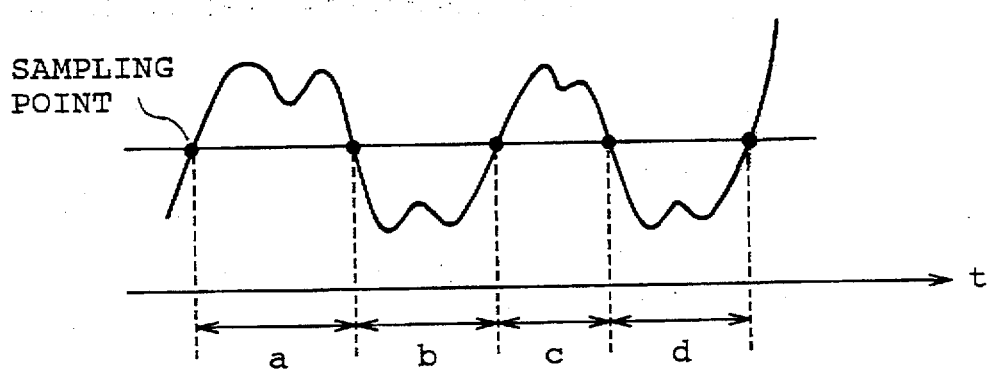
FIG. 16

RADIO TRANSMITTER AND METHOD OF CONTROLLING TRANSMISSION BY RADIO TRANSMITTER

BACKGROUND OF THE INVENTION

1. Field of the Invention

The present invention relates to a radio transmitter provided with automatic power control (APC) circuitry for setting the level or magnitude of a radio frequency (RF) output signal to a predetermined value, and a method of controlling the magnitude of an RF output signal to be furnished by a radio transmitter.

2. Description of the Prior Art

Generally, the transmission output power of mobile communication equipment such as a motor-vehicle-mounted radio transmitter or a movable radio transmitter can be varied due to variations in the system gain or the like caused by changes in environmental conditions such as an ambient temperature, a change in the voltage of a power supply disposed in the radio transmitter, and variations in the performance capabilities of components of the transmitter, so that the magnitude of the RF output signal can be varied. The magnitude of the RF output signal must fall within a prescribed range, which is defined by a standard to which a communications system including such radio transmitters conforms. Therefore, such radio transmitters need to monitor the magnitude of the RF output signal at all times and carry out a negative feedback to prevent variations in the RF output signal; that is, they need to carry out APC.

Referring now to FIG. 21, there is illustrated a block diagram of a prior art radio transmitter which needs linear amplification using for example π/4-shift quadrature phase shift keying (QPSK) modulation method. In the figure, reference numeral 1 denotes an RF signal modulated according to a modulation method such as the π/4-shift QPSK modulation method, and 2 denotes a variable gain element provided with a gain adjusting terminal, for controlling and changing the magnitude of the RF signal 1 in response to a control signal applied to the gain adjusting terminal, which will be mentioned below. The variable gain element can be constructed by for example an AGC amplifier, an attenuator, or the like. Furthermore, reference numeral 3 denotes a band-pass filter for eliminating unnecessary waves outside the transmission band, which are included in the RF signal 1 from the variable gain element 2, 4 denotes a linear power amplifier for amplifying the RF signal 1 so as to output an RF output signal 5 having a predetermined transmission power, 6 denotes a coupler for extracting a major part of the power of the RF output signal 5 and outputting it at its first output, and for extracting the remaining minor part of the power of the RF output signal 5 and outputting it at its second output, 7 denotes a detector for detecting the RF output signal furnished via the second output of the coupler 6 so as to obtain a detection signal 8 representing the magnitude of the RF output signal, and 9 denotes an envelope signal obtained from a baseband signal, which is a modulation signal, by calculations. In this case, the envelope signal represents the magnitude of the modulation signal for modulating according to the π/4-shift QPSK modulation method. Furthermore, reference numeral 10 denotes a variation eliminating circuit for comparing the detection signal 8 with the envelope signal 9 and for eliminating variations included in the detection signal 8 due to the modulation, 11 denotes a differential amplifier for comparing a signal delivered by the variation eliminating circuit 10 with a reference voltage 12 corresponding to the desired magnitude of the RF output signal output by the radio transmitter, and then furnishing a differential signal, and 13 denotes a filter for eliminating variations due to noise or the like from the differential signal so as to generate a control signal 14 used for controlling the gain of the variable gain element 2. As previously explained, this conventional APC circuitry is a negative feedback circuit, which operates in such a manner as to decrease the gain of the variable gain element 2 as the average power of the RF output signal 5 is increased, and increase the gain of the variable gain element 2 as the average power of the RF output signal 5 is decreased. Accordingly, the radio transmitter can provide the RF output signal 5 with a certain average power.

It is necessary for the prior art radio transmitter that needs such linear amplification to prevent modulated components which must be originally included in the RF output signal to be transmitted as a radio wave from being suppressed by the magnitude control provided by the APC circuitry (that is, disappearance of modulation information must be prevented). To this end, when generating the control signal 14, a control unit (not shown in FIG. 21) obtains the envelope signal 9 having a value related to the magnitude of the modulation signal by calculating a square root of $(I^2+Q^2)$ from the baseband signals which are the modulation signal, i.e., I and Q signals. Furthermore, the variation eliminating circuit 10 subtracts the envelope signal 9 from the detection signal 8 so as to eliminate variations included in the detection signal 8 due to the modulation. After that, the radio transmitter controls the gain of the variable gain element 2 by generating the control signal 14 from the differential signal having a value related to the difference between the detection signal without variations and the reference voltage 12. Since the prior art APC circuitry of the radio transmitter thus eliminates variations included in the detection signal 8 when generating the control signal 14, it can carry out the magnitude control for the RF output signal without any influence upon modulated components included in the RF output signal.

The magnitudes of the modulated components included in the detection signal 8 can be varied according to the absolute magnitude of the RF output signal 5. Therefore, in order for the variation eliminating circuit 10 to eliminate variations included in the detection signal, it is necessary to obtain the agreement between the levels of variations included in the detection signal 8 and the envelope signal 9 in advance. The level adjusting for the agreement can be carried out, mainly through a hardware processing, by correcting the level or magnitude of the envelope signal 9 on the basis of the magnitude of variations in the RF output signal which is estimated according to the magnitude of the RF output signal. Alternatively, the APC circuitry can correct the magnitude of the detection signal 8.

Such the prior art radio transmitter having the structure mentioned above needs hardware for correcting the level of the envelope signal 9 which corresponds to modulated varying components included in the detection signal 8 in addition to a software processing carried out in the control unit, in order to obtain the envelope signal 9 with high accuracy. Therefore, a problem is that the structure of the radio transmitter is complicated. Furthermore, a main part of the APC circuitry to generate the control signal 14 is constructed of circuitry in which analog and digital circuits such as the variation eliminating circuit 10 for eliminating variations included in the detection signal 8, differential amplifier 11 for generating the differential signal, and filter 13 for eliminating a noise are mixed. Thus, another problem is that the hardware of the APC circuitry is complicated and therefore the number of components which construct the hardware is increased.

SUMMARY OF THE INVENTION

The object of the present invention is to overcome the above problems. More precisely, it is an object of the present invention to provide a radio transmitter including automatic power control (APC) circuitry wherein arithmetic software processing and hardware for eliminating variations caused by modulation and included in a detection signal obtained from a radio frequency (RF) output signal can be reduced, and the function of generating a control signal for controlling the gain of the APC circuitry can be implemented via digital processing by software which results in reduction in hardware, thereby reducing the cost of the radio transmitter and improving the accuracy of automatic power control.

In accordance with one aspect of the present invention, there is provided a radio transmitter comprising: a transmission power control unit for controlling a gain thereof according to a control signal applied thereto and for amplifying a radio frequency (RF) signal input thereto to generate an RF output signal having a predetermined power; a power monitoring unit for monitoring the RF output signal so as to obtain an average power level of the RF output signal; an error calculating unit for calculating an error level from the difference between the average power level and a reference power level which corresponds to the predetermined power; and a control signal generating unit for multiplying the error level by a correction coefficient so as to obtain a control signal correction value for correcting the value of the control signal, and adjusting the value of the control signal to be delivered to the transmission power control unit on the basis of the control signal correction value and a reference control value that is predetermined so as to generate an RF output signal having the predetermined power.

In accordance with a preferred embodiment of the present invention, the transmission power control unit includes a variable gain element for adjusting the power of the RF signal by means of gain control, and a linear amplifier for linearly amplifying the RF signal adjusted by the variable gain element to furnish the RF output signal having the predetermined power, and wherein the power monitoring unit includes a detector for detecting an envelope from the RF output signal to furnish a detection signal, and an integrator for eliminating variations in the amplitude of the detection signal to furnish the average power level of the RF output signal. The power monitoring unit can include a sample and hold circuit for sampling the detection signal at predetermined intervals to furnish the average power level of the RF output signal, instead of the integrator.

Preferably, the variable gain element varies a gain thereof according to the value of the control signal applied thereto.

In accordance with another preferred embodiment of the present invention, the linear amplifier varies an operating point thereof according to the value of the control signal applied thereto, and wherein the radio transmitter further comprises a switching unit for setting the destination of the control signal to the variable gain element in digital mode and setting the destination of the control signal to the linear amplifier in analog mode. Preferably, the radio transmitter further comprises a bias control unit for applying a bias voltage to the linear amplifier. Furthermore, the control signal generating unit delivers a bias control signal having a value related to the value of the bias voltage to the bias control unit.

In accordance with another preferred embodiment of the present invention, the error calculating unit includes a power data recording unit for recording power data representing a current average power level of the RF output signal applied thereto so as to use the power data as the reference power level in a later calculation of the error level, and the control signal generating unit includes a control data recording unit for recording data representing a current value of the control signal so as to adjust the value of the control signal according to the data recorded if necessary in a later generation of the control signal.

In accordance with another preferred embodiment of the present invention, the error calculating unit includes a unit for correcting the average power level of the RF output signal obtained by the power monitoring unit. Preferably, the correcting unit makes a temperature correction to the average power level in consideration of an ambient temperature, and the correcting unit makes a channel correction to the average power level in consideration of the frequency of the RF output signal, i.e. a channel number used for transmitting the RF output signal.

In accordance with another aspect of the present invention, there is provided a method of controlling transmission of a radio transmitter, comprising steps of: generating a radio frequency (RF) output signal having a predetermined power from a radio frequency (RF) signal according to the value of a control signal by means of a gain control; monitoring the RF output signal so as to obtain an average power level of the RF output signal; calculating an error level from the difference between the average power level and reference power data which corresponds to the predetermined power of the RF output signal; calculating error data by multiplying the error level by coefficient data so as to correct the value of the control signal; and adjusting the value of the control signal on the basis of the error data and reference control data that is predetermined so as to generate an RF output signal having the predetermined power.

In accordance with a preferred embodiment of the present invention, a table is provided for storing a plurality of data sets each including reference power data, coefficient data, and reference control data which are predetermined with respect to a plurality of parameters defining transmission conditions of the radio transmitter. Preferably, the parameters include a system mode parameter, a channel band parameter, and a transmit power level parameter.

Further objects and advantages of the present invention will be apparent from the following description of the preferred embodiments of the invention as illustrated in the accompanying drawings.

BRIEF DESCRIPTION OF THE DRAWINGS

FIG. 8 is a view showing the internal structure of a shared data memory table in the first embodiment of the present invention;

FIG. 15a is a view showing sample and hold timing for a detection signal when all roll-off filtering is carried out in the radio transmitter according to the fourth embodiment of the present invention;

FIG. 15b is a view showing sample and hold timing for a detection signal when only 50% of roll-off filtering is carried out in the radio transmitter according to the fourth embodiment of the present invention;

FIG. 16 is a view showing sample and hold timing for sampling a detection signal at irregular intervals in the fourth embodiment of the present invention;

DETAILED DESCRIPTION OF THE PREFERRED EMBODIMENTS

Assume that the radio transmitter according to the present invention utilizes time-division multiple-access (TDMA) as an access method for use in mobile communications such as digital mobile telephones.

Figure 1:
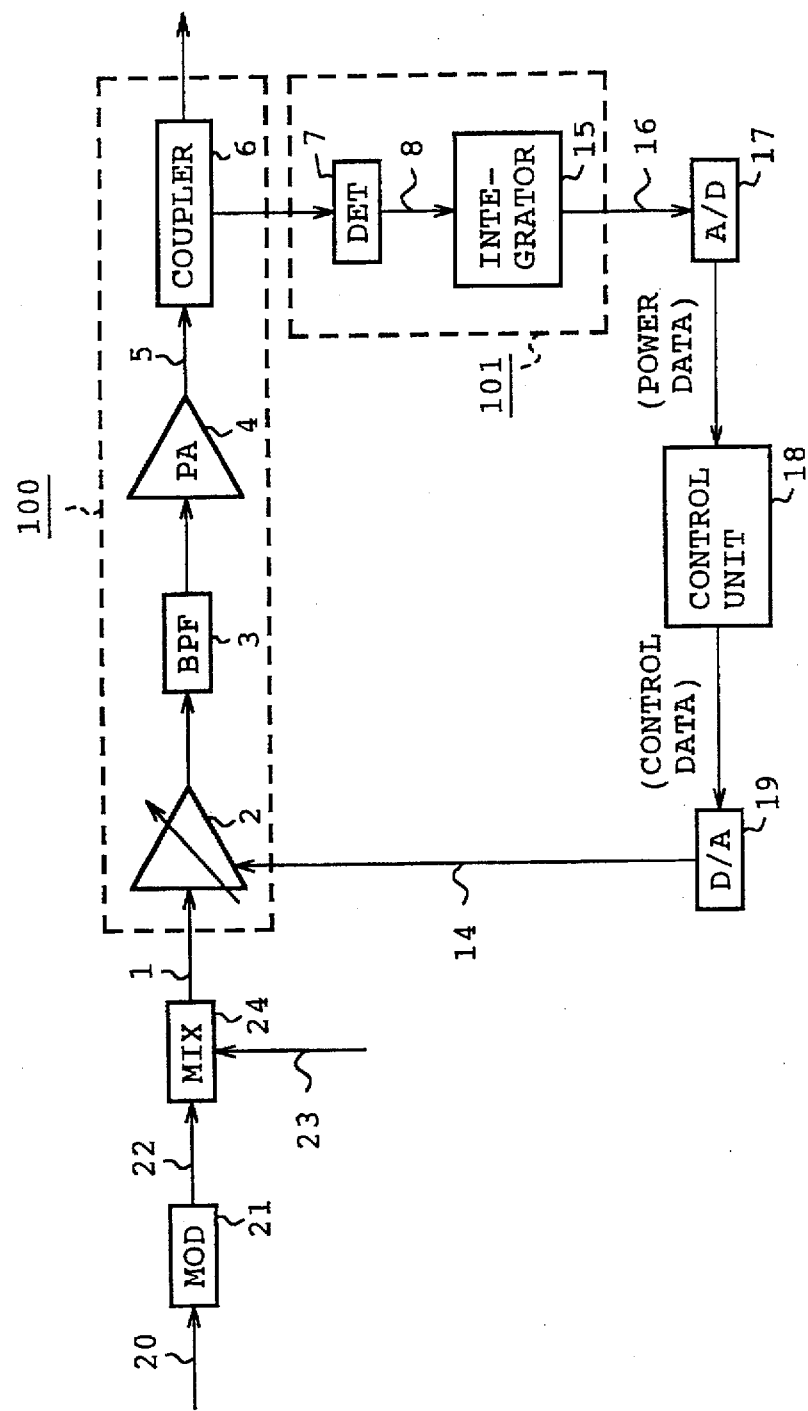
FIG. 1 is a block diagram of a radio transmitter according to a first embodiment of the present invention.
Figure 21:
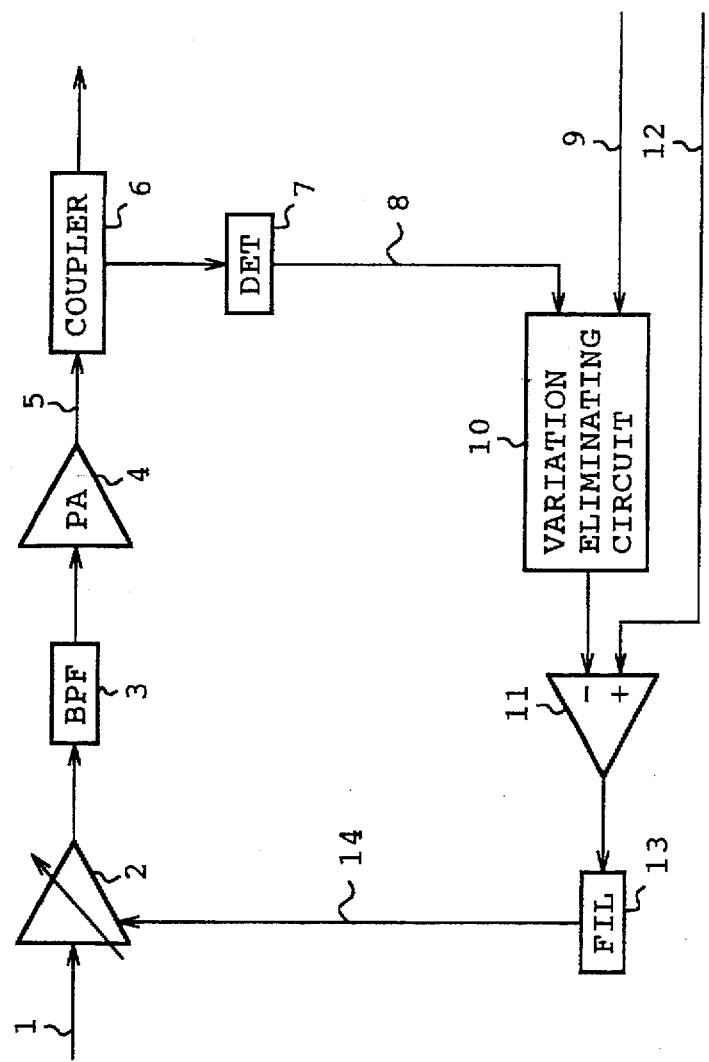
FIG. 21 is a block diagram of a prior art radio transmitter.

Referring now to FIG. 1, it illustrates a block diagram of a radio transmitter according to a first embodiment of the present invention. In the figure, reference numerals 1 to 8 denote the same components as those of the prior art radio transmitter shown in FIG. 21. Therefore, the description about the same components will be omitted hereinafter. Reference numeral 15 denotes an integrator which integrates a detection signal 8 so as to eliminate variations in the amplitude of the detection signal due to modulation, and 16 denotes a power signal having a value related to an average power level of an RF output signal 5 which is delivered by the integrator 15. Furthermore, reference numeral 17 denotes an analog-to-digital (A/D) converter which converts the analog power signal into a digital signal representing power data, 18 denotes a control unit which generates control data to control a variable gain element 2 by using the power data (i.e., a digitized power signal), 19 denotes a digital-to-analog (D/A) converter which converts a digital signal representing the control data (i.e., a digitized control signal) into an analog signal, and 14 denotes the analog signal, i.e., the control signal which is furnished by the D/A converter. Reference numeral 100 denotes a transmission power control unit which is comprised of the variable gain element 2, a band-pass filter 3, a linear power amplifier 4, and a coupler 6, and 101 denotes a power monitoring unit which is comprised of a detector 7 and the integrator 15.

Furthermore, reference numeral 20 denotes an intermediate frequency (IF) signal which is delivered by an oscillating circuit including for example a voltage-controlled oscillator, 21 denotes a modulating unit which modulates the IF signal according to for example the π/4-shift quadrature phase shift keying (QPSK) modulation method, 22 denotes the modulated IF signal which is furnished by the modulating unit 21, 23 denotes a local oscillating signal which is furnished by an oscillating circuit using for example a synthesizer system and will be mixed with the modulated IF signal so as to obtain a desired transmission frequency, and 24 denotes a mixer which mixes the local oscillating signal 23 and the modulated IF signal 22 to generate an RF signal 1 of the desired transmission frequency.

Figure 2:
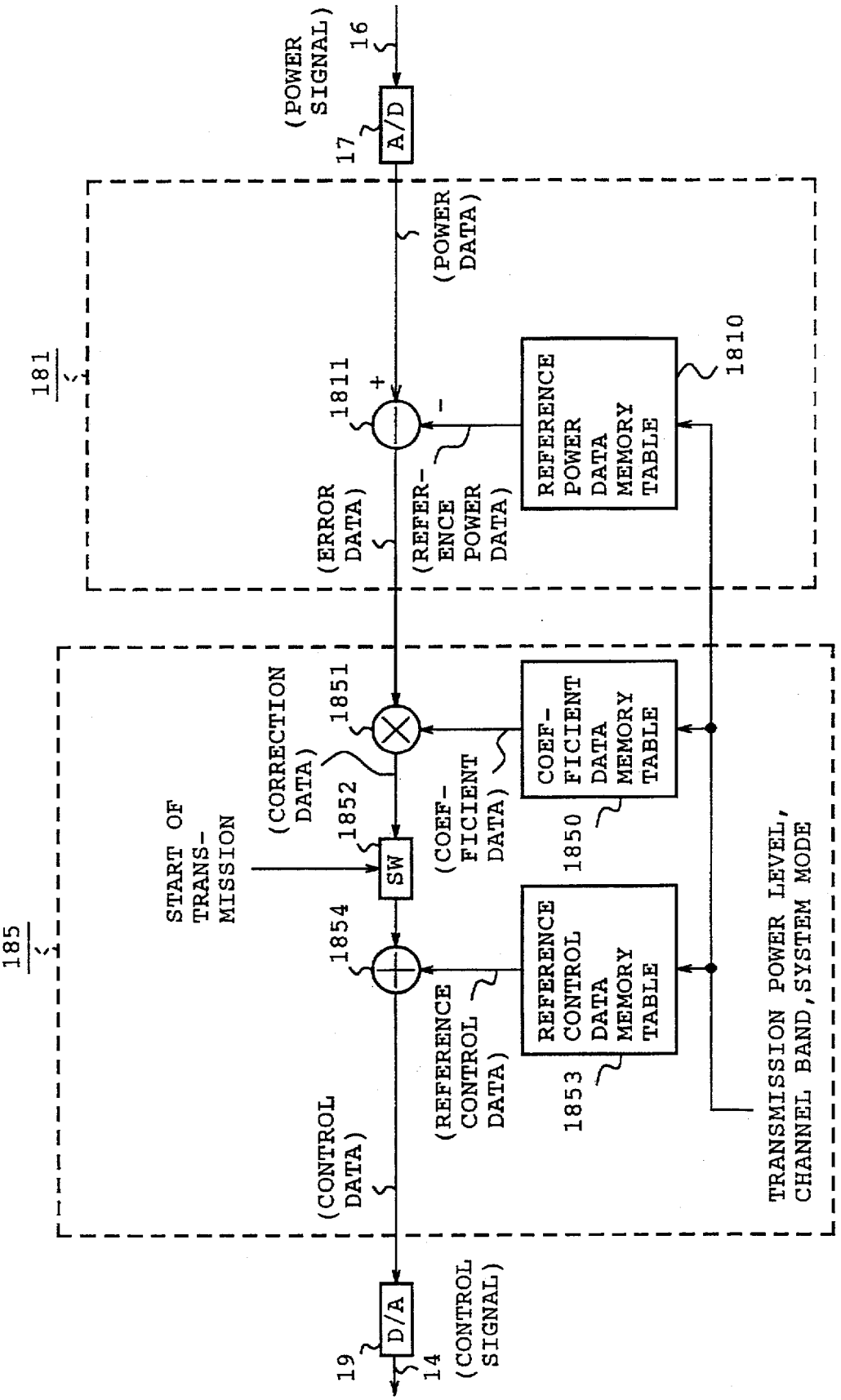
FIG. 2 is a block diagram of a control unit according to the first embodiment of the present invention.

Referring now to FIG. 2, it illustrates a block diagram showing the functional structure of the control unit 18. The control unit is functionally comprised of an error calculating unit 181 for generating error data as an error level from the power signal 16 and a control signal generating unit 185 for generating control data from the error data so as to adjust the value of the control signal 14. Reference numeral 1810 denotes a reference power data memory table in which a plurality of reference power data, which are predetermined with respect to table parameters that will be mentioned below and which corresponds to a reference level defined as an initial value of the power of the RF output signal 5, are stored, 1811 denotes a subtracter which obtains error data defined as the difference between the power which is obtained from the power signal 16 by the A/D converter 17 and the reference power data, 1850 denotes a coefficient data memory table in which a plurality of coefficient data which are predetermined with respect to the above table parameters are stored for converting the error data into correction data for correcting reference control data which defines an initial value of the control signal 14, 1851 denotes a multiplier which obtains the correction data defined as a value for correcting the reference control data by multiplying the error data by the coefficient data, 1852 denotes a switch for preventing the correction data from reaching an adder 1854, which will be mentioned below, at the time of starting transmission, 1853 denotes a reference control data memory table in which a plurality of reference control data each of which defines an initial value of the control signal 14 and which are predetermined with respect to the table parameters are stored, and 1854 denotes the adder which obtains the control data by adding the correction data delivered thereto by way of the switch 1852 to the reference control data from the reference control data memory table 1853.

Figure 3:
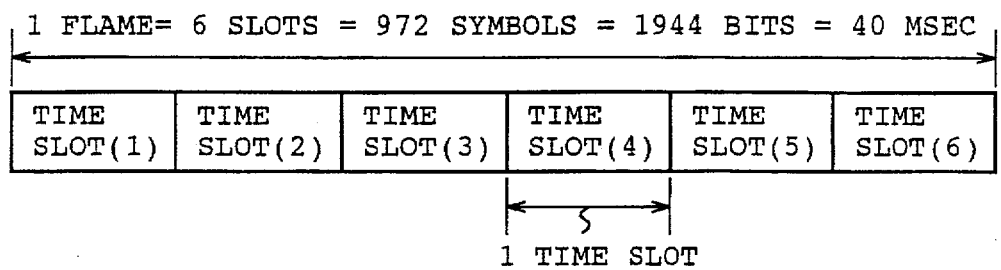
FIG. 3 is a view showing TDMA frame structure in the radio transmitter according to the first embodiment of the present invention.

Referring now to FIG. 3, it illustrates an example of the frame structure used for TDMA systems, i.e. the frame structure for North American type digital cellular systems which conform to IS-54 standard by North American EIA/TIA. Each frame has a duration of 40 msec and has the structure as follows:

1 frame=6 slots=972 symbols=1944 bits

Figure 4:
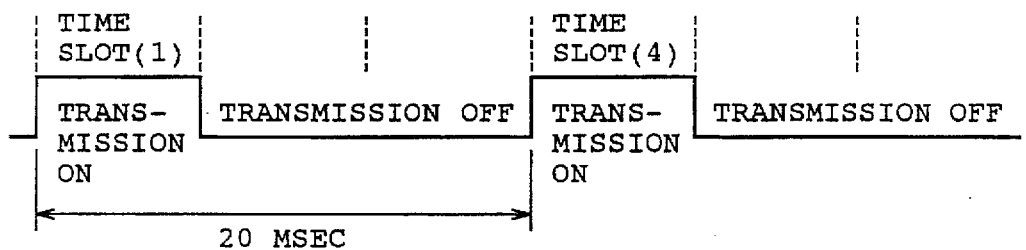
FIG. 4 is a timing diagram showing the transmission operation of the radio transmitter according to the first embodiment of the present invention.

The transmission timing is adjusted such that, if the transmission is carried out during the first time slot, the next transmission will be carried out during the fourth time slot. FIG. 4 shows such the operation of the radio transmitter in this case. As shown in the figure, the radio transmitter can deliver a radio wave during a "transmission-on" period of time, and it cannot deliver a radio wave during a "transmission-off" period of time. That is, the radio transmitter carries out burst transmission.

Next, a description will be made as to the operation of the radio transmitter according to the embodiment of the present invention. The IF signal 22 which is modulated by the modulating unit 21 according to the π/4-shift QPSK modulation is mixed with the local oscillating signal 23 within the mixer 24. As a result, the modulated RF signal 1 of a desired transmission frequency can be obtained.

After the variable gain element 2 adjusts the level or magnitude of the modulated RF signal 1, the filter 3 eliminates unnecessary components of the RF signal which are caused by for example the mixing operation by the mixer 24. Then, the linear power amplifier 4 amplifies the RF signal passing through the filter so that the RF signal has a certain transmission power. Finally, the power amplifier outputs the amplified signal as the RF output signal 5.

Figure 5:
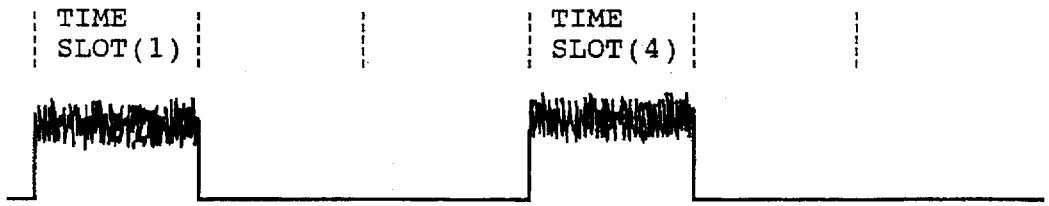
FIG. 5 is a view showing the waveform of a detection signal in the first embodiment of the present invention.

The coupler 6 extracts a part of the RF output signal 5 and sends it to the detector 7 which detects a detection signal from the RF output signal. The detection signal 8 of the RF output signal 5 which is detected by the detector 7 represents the envelope of the RF output signal 5, as previously mentioned. In the case of the π/4-shift QPSK modulation, the detection signal includes variations due to the modulation, as shown in FIG. 5. The periodicity of the variations is similar to the time width of symbols (or the symbol rate).

Figure 6:
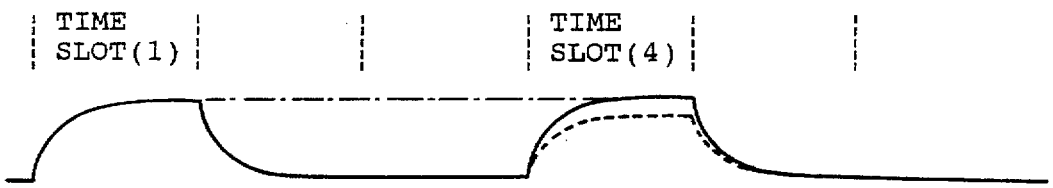
FIG. 6 is a view showing the waveform of a power signal in the first embodiment of the present invention.

The detection signal 8 is applied to the integrator 15. The integrator 15 eliminates the variations of the detection signal due to the modulation so that the power signal 16 output by the integrator has a smooth waveform as shown in FIG. 6. Thus, like a low-pass filter, the integrator 15 eliminates the variations of the detection signal due to the modulation, the variations having relatively higher frequencies as compared with the duration of time slots, and outputs a signal representing an average level of an input signal within each time slot. Since the cycles of variations (nearly equal to the rate of symbols) due to the π/4-shift QPSK modulation which conforms to IS-54 standard are about 46 μsec and the period of one time slot (i.e., the duration of one time slot) is about 6.67 msec, the time constant of the integrator is set to about 1 msec.

If the average output powers during all the transmission time slots are the same, the power signal 16 which is the output of the integrator 15 has an identical value at its stable state, i.e., an identical final value near the end of each of the transmission time slots. On the contrary, if the average output power during the time slot (4) is lower than that during the time slot (1), the power signal 16 which is the output of the integrator 15 has a final value as designated by a dotted line shown in the time slot (4) of FIG. 6.

In the above case where the power signal 16 can have a final value as designated by the dotted line shown in FIG. 6, the time constant of the integrator is set to a value in the range from the symbol rate to the time slot period. The setting is needed in order to eliminate variations in the detection signal 8 and obtain the average level of the power signal 16 within each of the transmission time slots. However, the time constant of the integrator can be set to a larger value than the time slot period in order to eliminate variations in the detection signal 8 more effectively, because the APC circuitry only needs the relative level differences between the transmission time slots.

As shown in FIG. 2, the A/D converter 17 digitizes the power signal 16 from the integrator 15. The error calculating unit 181 in the control unit 18 computes the error data from the difference between the digitized power signal (i.e. power data) and the reference power data stored in the reference power data memory table 1810 within the error calculating unit 181. The control signal generating unit 185 computes the correction data to correct the reference control data which corresponds to an initial value of the control signal 14, and adds the correction data to the reference control data so as to generate the control data. The control data is digital-to-analog converted by the D/A converter 19 to generate the control signal 14 for controlling the variable gain element 2.

As previously mentioned, the radio transmitter of the present embodiment makes it possible to obtain the RF output signal 5 having a certain level by computing the correction data on the basis of the error data so as to adjust the value of the control signal 14 at predetermined intervals.

Figure 7:
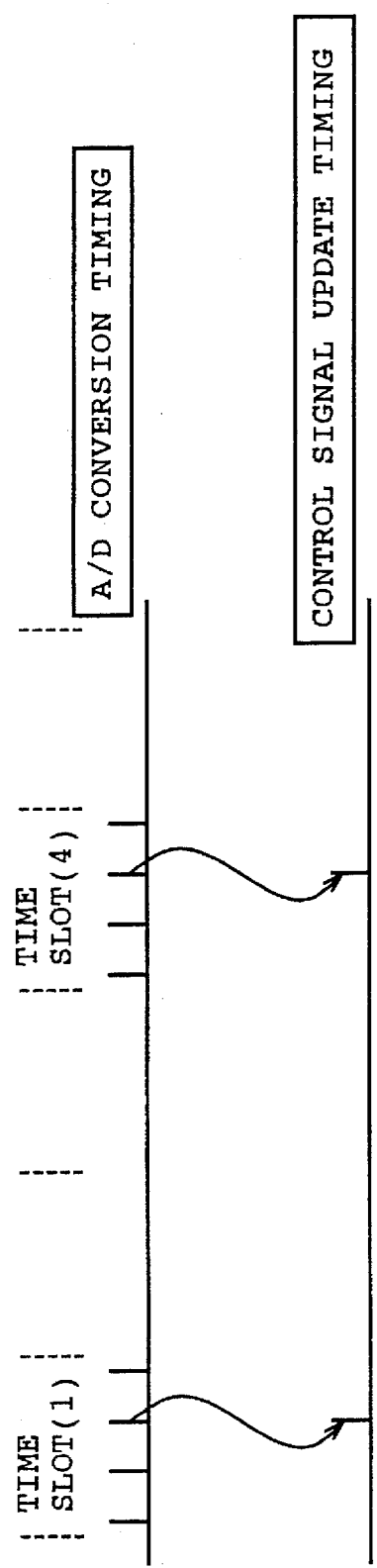
FIG. 7 is a timing diagram showing a relationship between A/D conversion timing and control signal update timing in the first embodiment of the present invention.

In the TDMA radio transmitter according to this embodiment, the APC is carried out only during each of the transmission time slots within which the value of the control signal 14 can be adjusted. In this manner, the adjustment can be carried out during each of the transmission time slots; however, the adjustment can be alternatively carried out during a transmission time slot within a predetermined period of time including a plurality of transmission time slots. The adjustment can be carried out any number of times within one transmission time slot during which the adjustment is allowed. The cycle of conversion of the A/D converter is set to be shorter than the adjustment cycle. As mentioned above, a digital value obtained by analog-to-digital converting the power signal 16 is used as the power data. Alternatively, the mean value of a plurality of digital values obtained by analog-to-digital converting the power signal 16 several times during each of the transmission time slots can be used as the power data. In the case of using the mean value, an averaging unit is added to the backward stage of the A/D converter 17 for storing a plurality of analog-to-digital converted values and computing and outputting the mean value of the plural analog-to-digital converted values. Hereinafter, assume that the power signal which was analog-to-digital converted at a predetermined timing during each of the transmission time slots are used as the power data, and the value of the control signal is updated only once during each of the transmission time slots, unless explained otherwise in the description of the present invention. FIG. 7 shows a relationship between the conversion timing for the A/D conversion and the update timing for the adjustment of the control signal. As shown in FIG. 7, the A/D conversion is carried out four times during each of the transmission time slots, and the update of the control signal is carried out by using the third power data during each of the transmission time slots.

Next, the description will be directed to the operation of the control unit 18. Referring next to FIG. 8, there is illustrated a table showing the internal structure of a shared data memory table which can include the reference power data memory table 1810, coefficient data memory table 1850, and reference control data memory table 1853, which is a component of the control unit 18. In the shared data memory table, a number of data sets each including reference power data, coefficient data, and reference control data are stored. Each of the data sets is predetermined uniquely with respect to a combination of table parameters (which will be referred to as parameters, hereinafter) including a system mode, a channel band, and a transmission power level. The system mode is referred to as a mode in which the radio transmitter is used. In IS-54 standard, there are two modes, i.e., analog mode (A) and digital mode (D). The channel band is referred to as the frequency position within the radio band. In the preferred embodiment, the radio band is divided into three band sections of H (high), M (middle), and L (low), respectively. One of the band sections is selected according to the frequency that the radio transmitter uses. The power level is referred to as the magnitude, i.e., the power of the RF output signal. In the example shown in FIG. 8, the shared data memory table is generalized with respect to the power level parameter so that the power of the RF output signal can be classified into n of power levels.

Each of the data sets can be obtained using the following method. A measurement system which can receive the control data manually without activating the control unit shown in the block diagram of FIG. 1 and then monitor the level or magnitude of the RF output signal 5 and the digital value of the power data was set up as a preparation to the measurement of the data sets. First, a combination of parameters is predetermined. The digital value of the control data is adjusted by manually varying it so that the magnitude of the RF output signal 5 reaches a certain power level which corresponds to the transmission power level defined by the predetermined combination of parameters. The value of the control data at that time is chosen as the reference control data. Furthermore, the value of the power data at that time is chosen as the reference power data. Such the measurement is carried out for all the combinations of parameters to generate the table as shown in FIG. 8. The coefficient data is equivalent to a ratio of a variation in the power data to a variation in the control data and is obtained using the reference power data and reference control data obtained as mentioned above by the following equation:

coefficient data at power level $k =$

{reference control data at power level $k + 1 -$ reference control data at power level $k$}/

{reference power data at power level $k + 1 -$ reference power data at power level $k$}

Figure 9:
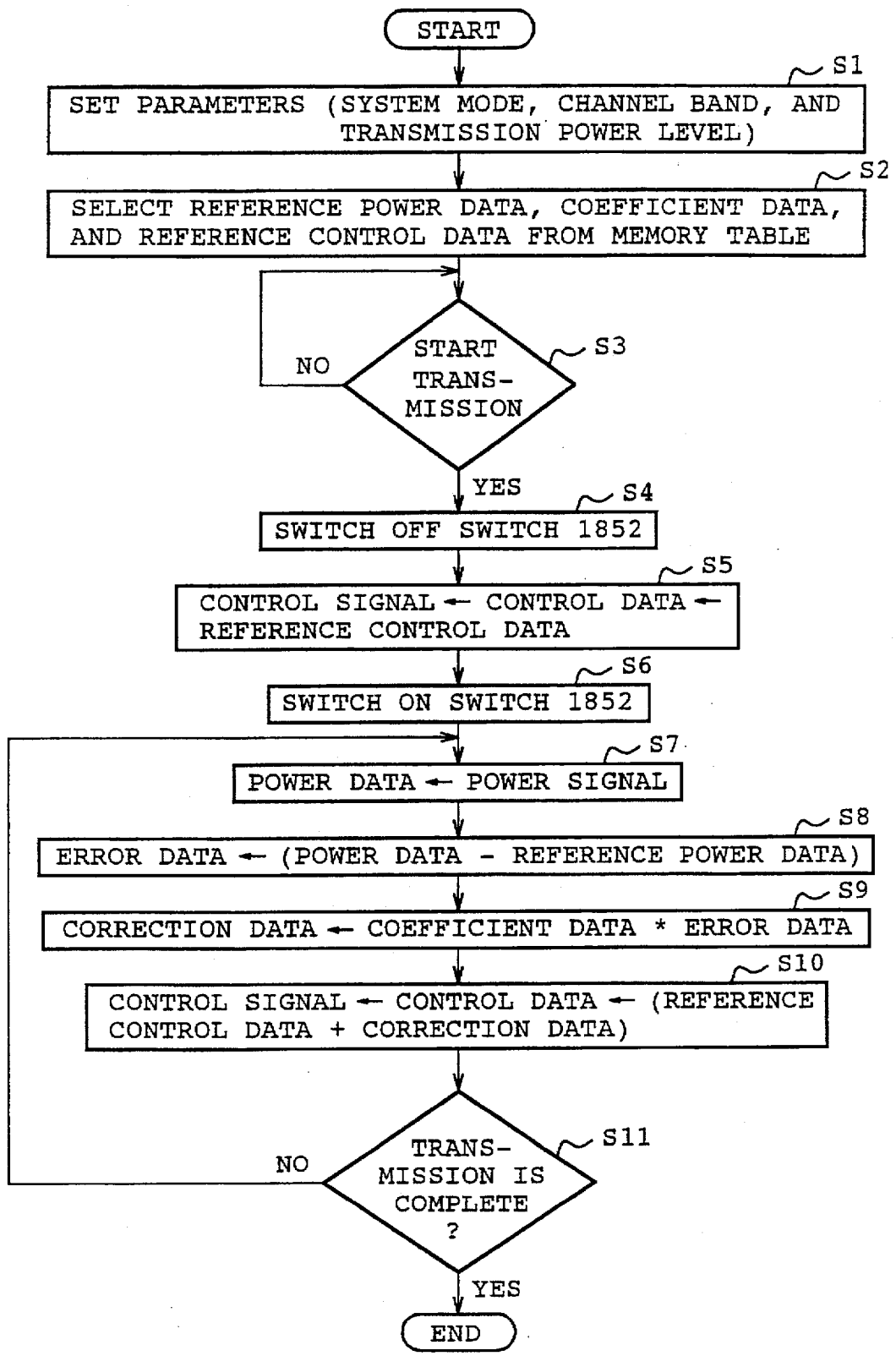
FIG. 9 is a flow diagram showing the operation of the control unit in the radio transmitter according to the first embodiment of the present invention.

Referring now to FIG. 9, there is illustrated a flow diagram showing the operation of the control unit 8. When the use of the radio transmitter is started, a combination of parameters for selecting reference power data, coefficient data, and reference control data from the shared data memory table is determined and is applied to each of the memory tables, in step S1. Then, a set of data including reference power data, coefficient data, and reference control data can be selected from the shared data memory table according to the combination of parameters, in step S2. Hereinafter, a description will be made as to the case where the parameter combination is composed of digital mode (D), channel (M), and power level 2, and "data (D2M)" are used as the data set. Furthermore, each data of the data set will be referred to as for example "reference control data (D2M)".

After the radio transmitter, in step S3, monitors whether or not transmission is started, it switches off the switch 1852 at the time of starting transmission, in step S4. Then, the radio transmitter, in step S5, adjusts the gain of the variable gain element 2 according to the value of the control signal 14, which corresponds to the digital value of the reference control data (D2M) stored in the reference control data memory table 1853. After that, the radio transmitter switches on the switch 1852 and then closes the loop of the APC circuitry, in step ST6. After the closed loop is established, the operation of the radio transmitter is performed as follows. After the error calculating unit 181, in step S7, captures the power signal as the power data, it computes the error data from the difference between the power data and the reference power data (D2M) stored in the reference power data memory table 1810 by means of the subtracter 1811, in step S8. Next, the multiplier 1851 computes the correction data by multiplying the error data by the coefficient data (D2M) stored in the coefficient data memory table 1850, in step S9. Then, the adder 1816 adds the correction data to the reference control data stored in the reference control data memory table 1853 so as to update or adjust the value of the control signal 14, in step S10. Steps 7 to 10 are repeated until the transmission is completed, in step 11.

As previously explained, since the radio transmitter according to the first embodiment of the present invention is adapted to eliminate variations included in the detection signal 8 due to the modulation by means of the integrator 15, the radio transmitter does not need software processing for eliminating such variations. Another advantage is that the hardware of the radio transmitter can be simplified. Furthermore, the embodiment offers the advantage of being able to provide the APC with high accuracy because the error data and control data are generated through digital processing in the control unit 18.

Figure 10:
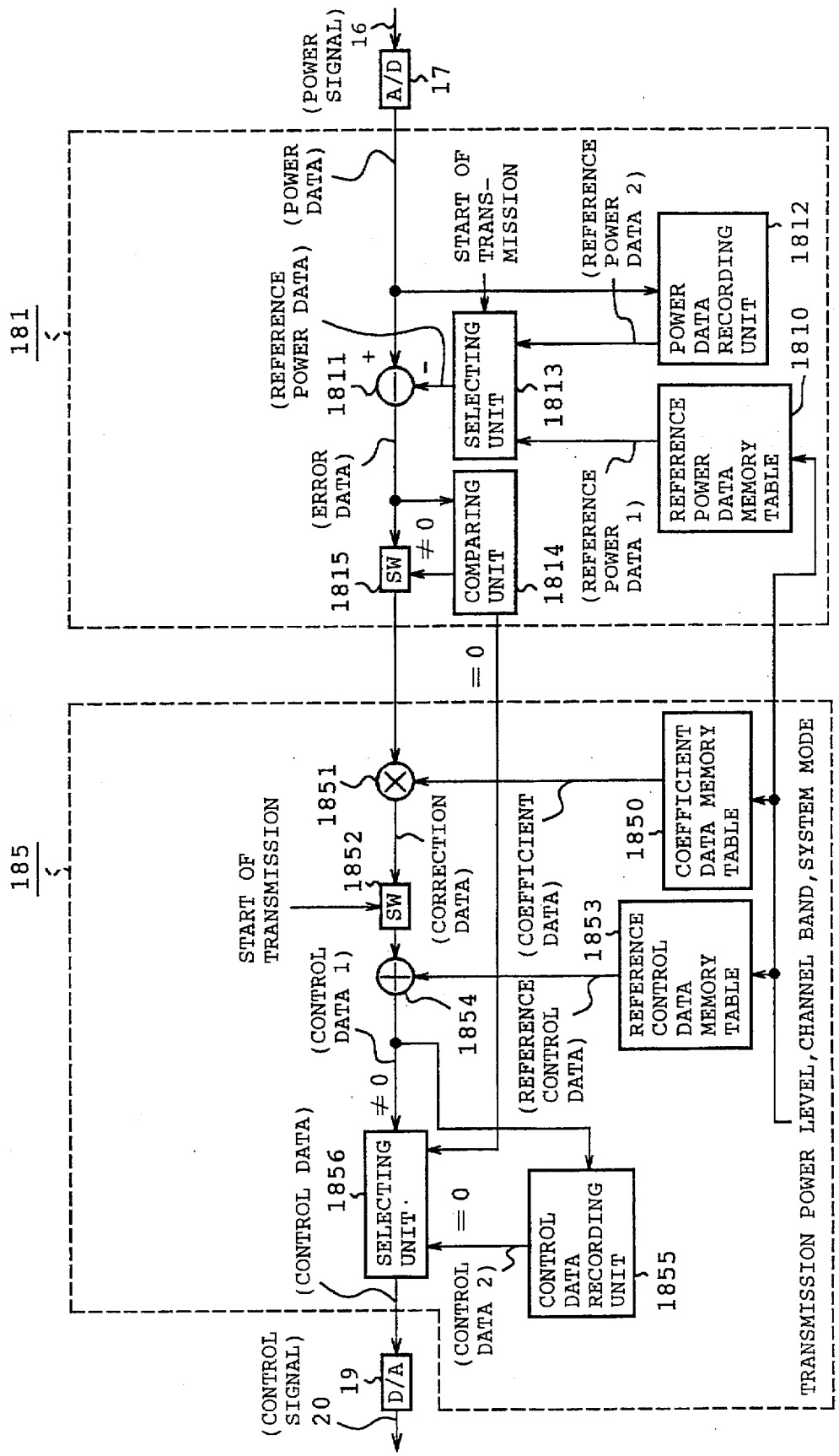
FIG. 10 is a block diagram of a control unit in a radio transmitter according to a second embodiment of the present invention.

Referring next to FIG. 10, there is illustrated a block diagram showing the functional structure of a control unit 18 of a radio transmitter according to a second embodiment of the present invention. The main components of the radio transmitter according to this embodiment are the same as those of the radio transmitter according to the first embodiment shown in FIG. 1, and therefore the description about the components will be omitted hereinafter. The present embodiment is intended to simplify the process of computing the error data and correction data by providing a unit for recording preceding power data and control data. In FIG. 10, reference numeral 1812 denotes a power data recording unit which records the power data delivered by the A/D converter 17 and which outputs the power data as reference power data 2, 1813 denotes a selecting unit which selects either the reference power data 1 delivered by the reference power data memory table 1810 or the reference power data 2 delivered by the power data recording unit 1812, and then outputs the selected one as the reference power data, 1814 denotes a comparing unit which determines whether the error data delivered by the subtracter 1811 is zero or not, 1815 denotes a switch which can be switched on, when the comparison result from the comparing unit shows that the error data is not zero, so as to deliver the error data to the multiplier 1851, 1855 denotes a control data recording unit which records the control data 1 delivered by the adder 1854 and then outputs it as control data 2, and 1856 denotes a selecting unit which selects either the control data 2 output by the control data recording unit 1855 or the control data 1 output by the adder 1854, and then outputs the selected one as the control data.

Figure 11:
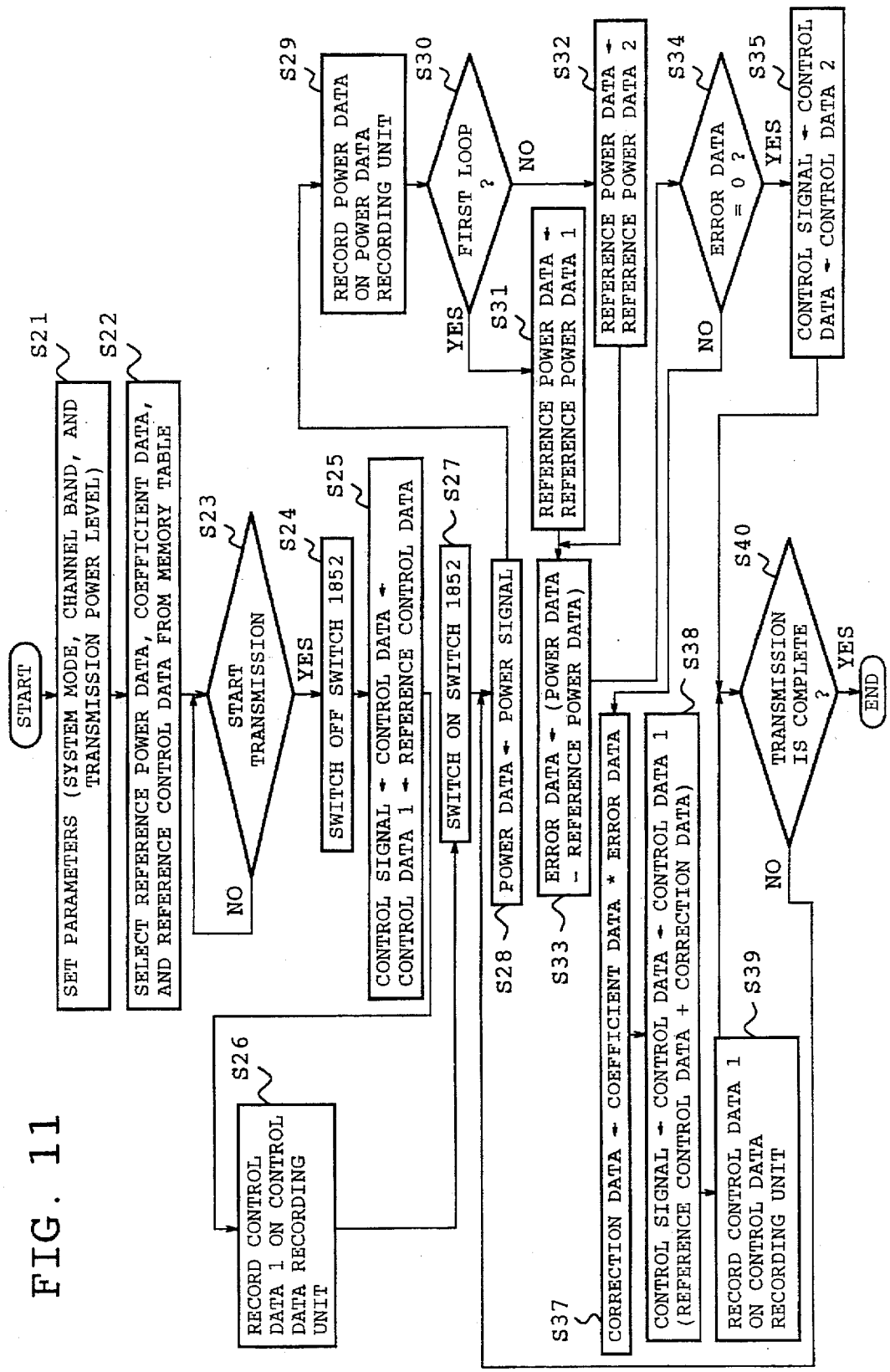
FIG. 11 is a flow diagram showing the operation of the control unit in the radio transmitter according to the second embodiment of the present invention.

Next, a description will be made as to the operation of the control unit 18 with reference to FIG. 11. When the use of the radio transmitter is started, a combination of parameters is determined and is applied to each of the memory tables, in step S21. A set of data including reference power data, coefficient data, and reference control data is selected from the shared data memory table according to the combination of parameters, in step S22. After the radio transmitter, in step S23, monitors whether or not transmission is started, it switches off the switch 1852 at the time of starting transmission, in step S24. Then, the radio transmitter,. in step S25, adjusts the gain of the variable gain element 2 by selecting, as the control data 1, the reference control data (D2M) which is stored for defining the initial value of the control signal in the reference control data memory table 1853, making the selecting unit 1856 select the control data 1 as the control data, and generating the control signal 14 having a value related to the digital value of the control data, while the control data recording unit 1855, in step S26, records the control data 1. After that, the radio transmitter switches on the switch 1852 and then closes the loop of the APC circuitry, in step ST27. After the closed loop is established, the operation of the radio transmitter is performed as follows. The error calculating unit 181, in step S28, captures the power data representing the average magnitude of the RF output signal, and records the power data on the power data recording unit 1812. After the selecting unit 1813 determines, in step S30, whether or not it is time just after the radio transmitter has begun to transmit, i.e. whether or not the current error calculation is the first one after the current transmission is started, the selecting unit 1813 selects the reference power data 1 (D2M) output by the reference power data memory table 1810 if it is time just after the radio transmitter has begun to transmit, and then furnishes the reference power data 1 as the reference power data, in step S31. Except if it is time just after the radio transmitter has begun to transmit, the selecting unit 1813 selects reference power data 2, i.e., the immediately preceding power data delivered by the power data recording unit 1812, and then furnishes the reference power data 2 as the reference power data, in step S32. Then, the subtracter 1811, in step S33, computes the error data from the difference between the power data and the reference power data. Next, the comparing unit 1814, in step S34, determines whether the error data is equal to zero. If the error data is not equal to zero, the error calculating unit 181 switches off the switch 1815 and then furnishes the error data to the multiplier 1851 wherein the correction data are computed by multiplying the error data by the coefficient data (D2M) stored in the coefficient value memory table 1850, in step S37. Then, the adder 1816 adds the correction data to the reference control data stored in the reference control data memory table 1853 so as to furnish the control data 1. Since the selecting switch 1856 selects the control data 1 as the control data when the error data is not zero, the value of the control signal 14 is updated so that it has a value related to the digital value of the control data 1, in step S38. The control data 1 is also recorded on the control data recording unit 1855, in step S39. On the contrary, when the error data is equal to zero in step S34, the control data 2 delivered by the control data recording unit 1855 is selected as the control data, the value of the control signal 14 is adjusted, in step S35, so that it has a value related to the digital value of the control data 2. Steps S28 to S39 are repeated until the transmission is completed, in step S40.

As previously mentioned, the radio transmitter according to the second embodiment of the present invention is adapted to compute the error data by using, as the reference power data, the immediately preceding power data (i.e., the power data obtained during the immediately preceding time slot) recorded on the power data recording unit 1812, and use previous control data recorded on the control data recording unit 1855 when the error data is equal to zero, so as to update the value of the control signal 14. Therefore, the embodiment offers the advantage of being able to omit the process of computing the correction data and control data 1, and hence simplify the update processing.

When the radio transmitter is used in a real-world setting, there is a possibility that errors occur due to variations in the voltage of a power supply, variations in the temperature of the radio transmitter, or the like, if data (which were measured in a specified environmental condition) recorded on the shared data memory table in advance are simply used. For example, the detection voltage of a detection diode which is incorporated into the detector 7 changes according to its temperature. Furthermore, the power level of the RF output signal varies depending on its frequency (i.e., the channel number used for transmission) even though the channel band is identical, because of the frequency characteristic of the power amplifier or the like. In addition, even when the voltage of the power supply is varied at the time of starting transmission, the power level of the RF output signal can be varied. In order to overcome the disadvantage, there can be provided various correction units within the aforementioned control unit for eliminating variations in the power level of the power signal, as will be explained below.

Figure 12:
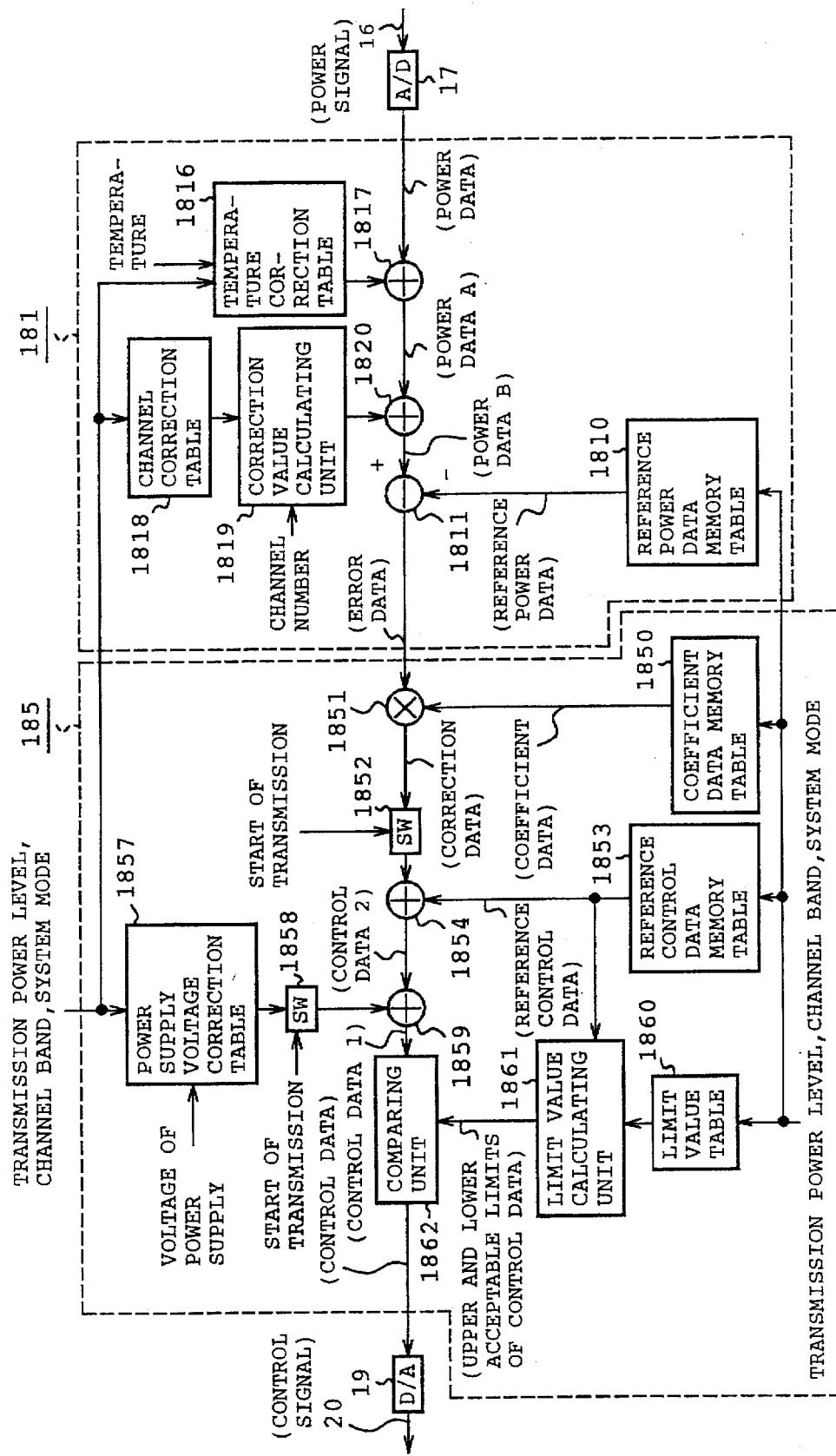
FIG. 12 is a block diagram of a control unit in a radio transmitter according to a third embodiment of the present invention.

Referring now to FIG. 12, it illustrates a block diagram showing the functional structure of the control unit 18 of a radio transmitter according to a third embodiment of the present invention. The main components of the radio transmitter according to this embodiment are the same as those of the radio transmitter according to the first embodiment shown in FIG. 1, and therefore the description about the components will be omitted hereinafter. In FIG. 12, reference numeral 1816 denotes a temperature correction table in which a plurality of temperature correction data used for correcting the power data from the A/D converter 17 are stored. The plural temperature correction data are predetermined with respect to the table parameters mentioned above and temperature data (e.g., the output of a thermistor disposed in a temperature compensated oscillator). Furthermore, reference numeral 1817 denotes an adder which computes temperature-corrected power data A from the power data and the temperature correction data, and 1818 denotes a channel correction table in which a plurality of channel correction data used for correcting the power data are stored. The channel correction data are predetermined with respect to the table parameters. Reference numeral 1819 denotes a correction value calculating unit which computes a channel correction value from the channel correction data and a transmission channel number, 1820 denotes an adder which computes channel-corrected power data B from the temperature-corrected power data A and the channel correction value, and 1857 denotes a power supply voltage correction table in which a plurality of power supply voltage correction data used for correcting the control data are stored. The plural power supply voltage correction data are predetermined with respect to the table parameters and an expected voltage of the power supply. Furthermore, reference numeral 1858 denotes a switch which allows the power supply voltage correction data to pass therethrough and reach an adder 1859, which will be mentioned below, at the time of starting transmission, 1859 denotes the adder which computes power-corrected control data 1 from the control data output by the adder 1854 and the power supply voltage correction data, and 1860 denotes a limit value table in which a plurality of acceptable variations in the reference control data are stored. The plural acceptable variations are predetermined with respect to the table parameters. Reference numeral 1861 denotes a limit value calculating unit which computes upper and lower acceptable control data from the reference control data and the acceptable variation in the reference control data, and 1862 denotes a comparator which compares the power supply voltage corrected control data 1 with the upper and lower acceptable control data and then selects either one of them so as to output the selected one as the control data.

Like the aforementioned various memory tables, the temperature correction table, channel correction table, and power supply voltage correction table are created by obtaining the temperature correction data, channel correction data, and power correction data on the basis of power data and control data which were measured for each set of table parameters, and recording them on the temperature correction table, channel correction table, and power correction table, respectively.

Each of these correction data can be obtained as follows:

(1) temperature correction table

First, the ambient temperature of the radio transmitter is classified into three ranges, i.e. a high temperature range,. a normal temperature range, and a low temperature range. Using the aforementioned method, the reference power data which depends on each combination of table parameters can be obtained in the case where the ambient temperature of the equipment is set to a representative temperature within each of the three temperature ranges (for example, 40° C. in the case of the high temperature range, 25° C. in the case of the normal temperature range, and 0° C. in the case of the low temperature range). The differences between the reference power data at the high and low temperatures and the reference power data at the normal temperature are recorded as the temperature correction data on the temperature correction table. When the ambient temperature of the radio transmitter is within the high or low temperature range, the error calculating unit 181 adds the temperature correction data to the power data delivered thereto and converts the power data into corresponding power data at the normal temperature on the basis of temperature information from the thermistor so as to correct the original power data.

(2) channel correction table

As mentioned above, the channel band can be classified into the three bands H, M, and L and the reference power data can be obtained for a representative channel within each of the three channel bands. In order to interpolate the reference power data for a channel within each of the three bands except the representative channel, the slope of a line connected between the two reference data obtained for the H and M bands and the slope of a line connected between the two reference data obtained for the M and L bands are calculated and then recorded on the channel correction table together with the three reference power data obtained for the representative channels of the three channel bands. The channel correction is carried out in such a manner that the error calculating unit 181 computes a deviation from the reference power data for the representative channel on the basis of the channel correction data and a real transmission frequency (i.e. channel number), and adds the deviation to the power data delivered thereto and converts the power data into corresponding power data at the representative channel so as to correct the original power data.

(3) power supply voltage correction table

The initial value of the control signal 14 which was measured when the voltage of the power supply was set to a normal value is recorded as the reference control data. The difference between the reference control data and control data which was measured when the voltage of the power supply was set to a voltage which can be expected at the time of starting transmission (the use of the power amplifier causes an increase in the operating current and therefore varies the voltage of the power supply) is recorded on the power supply voltage correction table. When the radio transmitter starts to transmit while the voltage of the power supply varies, the power supply voltage correction is carried out in such a manner that the above-mentioned difference is added to the control data so as to correct the control data.

Figure 13:
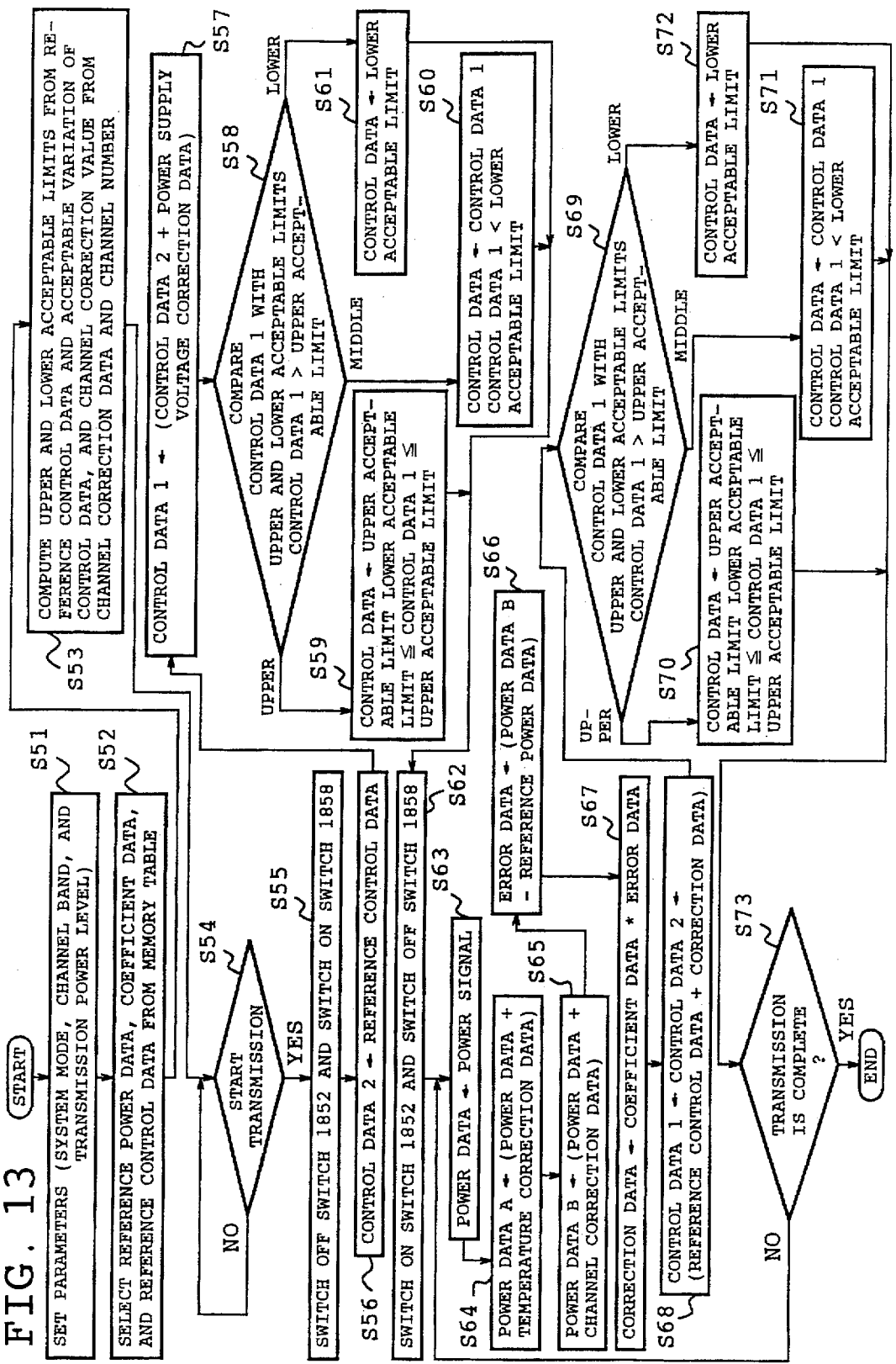
FIG. 13 is a flow diagram showing the operation of the control unit in the radio transmitter according to the third embodiment of the present invention.

Next, a description will be made as to the operation of the control unit 18 with reference to FIG. 13. When the use of the equipment is started, a combination of parameters is determined and is applied to each of the memory tables, in step S51. Then, according to the combination of parameters, a set of data including reference power data, coefficient data, and reference control data is selected from the data memory tables and the various correction data as mentioned above are selected from the correction tables, in step S52. Next, the limit value calculating unit 1861 computes upper and lower limits of the acceptable control data on the basis of the reference control data and the acceptable variation in the reference control data, and the correction value calculating unit 1819 computes a channel correction value on the basis of the channel correction data and the channel number, in step S53. The radio transmitter, in step S54, monitors whether or not transmission is started. If the radio transmitter starts to transmit, the radio transmitter, in step S55, switches off the switch 1852 and switches on the switch 1858. Then, the control signal generating unit 185, in step S56, outputs, as the control data 2, the reference control data (D2M) which is stored, as the initial value of the control signal 20, in the reference control data memory table 1853. Furthermore, the control signal generating unit 185, in step S57, makes a correction to the control data 2 by using the power supply voltage correction data, which is selected according to the table parameters and the voltage of the power supply at the time of starting transmission, so as to generate the control data 1. The comparing unit 1862 compares the control data 1 with the upper and lower limits of the acceptable control data, in step S58. According to the comparison result, one of the upper limit acceptable control data, control data 1, and lower limit acceptable control data is selected and furnished as the control data. That is, if the control data 1< the lower limit of the acceptable control data, the lower limit of the acceptable control data is selected. If the lower limit of the acceptable control data $\leq$ the control data 1 $\leq$ the upper limit of the acceptable control data, the control data 1 is selected. If the control data 1> the upper limit of the acceptable control data, the upper limit of the acceptable control data is selected. Finally, the radio transmitter, in steps S59, S60, and S61, sets the gain of the variable gain element 2 by using the control signal 14 having a value related to the digital value of data selected from among the control data 1, and the upper and lower limits of the acceptable control data. After that, the radio transmitter switches on the switch 1852 and switches off the switch 1858 and then closes the loop of the APC circuitry, in step ST62. After the closed loop is established, the operation of the radio transmitter is performed as follows. The error calculating unit 181, in step S63, captures the power data representing the value of the power signal. Then the error calculating unit 181, in step S64, makes the temperature correction to the power data, and then, in step S65, makes the channel correction to the power data. The subtracter 1811, in step S66, computes error data from the difference between the temperature-corrected and channel-corrected power data B and the reference power data. Then, the multiplier 1851 computes correction data by multiplying the error data by the coefficient data (D2M) stored in the coefficient value memory table 1850, in step S67. After that, the adder 1816 adds the correction data to the reference control data stored in the reference control data memory table 1853 so as to furnish control data 2, in step S68. After the control data 2 passes through the adder 1895 without being power-corrected and then reaches, as control data 1, the comparing unit 1862 in which the control data 1 is compared with the upper and lower limits of the acceptable control data, in step S69. Then, one of the upper limit of the acceptable control data, control data 1, and lower limit of the acceptable control data is selected according to which one among the above inequalities is held and delivered as the control data and the value of the control signal 14 is finally updated, in step S70, S71, or S72. Steps S63 to S72 are repeated until the transmission is completed, in step S73.

As previously mentioned, the radio transmitter according to the third embodiment of the present invention is adapted to correct the control data according to the voltage of the power supply immediately after the radio transmitter starts to transmit, and correct the power data according to variations in the ambient temperature of the transmitter and the channel number. Therefore, the embodiment offers the advantage of being able to generate the control signal with high accuracy, and hence improving the accuracy of the APC.

According to the present invention, the radio transmitter can be preferably implemented as explained in the description about the second embodiment with reference to FIG. 10, and may be alternatively implemented as explained in the description about the third embodiment with reference to FIG. 12. Furthermore, the radio transmitter which combines the functions of the second and third embodiments can be alternatively implemented. This variant can offer the advantages provided by both of the embodiments.

Figure 14:
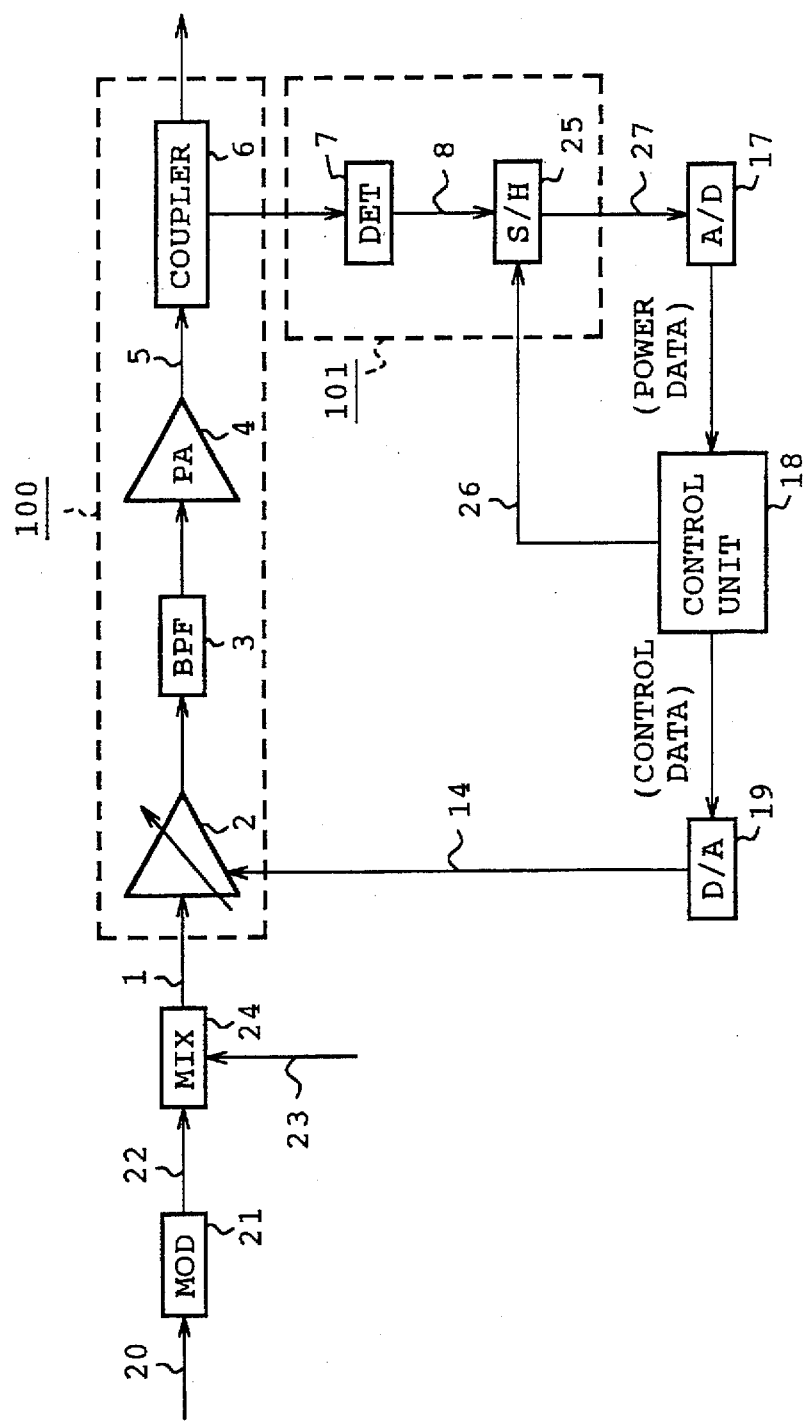
FIG. 14 is a block diagram of a radio transmitter according to a fourth embodiment of the present invention.

Referring next to FIG. 14, there is illustrated a block diagram of a radio transmitter according to a fourth embodiment of the present invention. The power monitoring unit 101 according to this embodiment is provided with a sample and hold circuit for eliminating variations from the detection signal 8 which is obtained from the RF output signal 5 delivered by the detector 7, instead of the integrator as shown in FIG. 1.

In FIG. 14, reference numeral 25 denotes the sample and hold circuit, 26 denotes a timing signal for triggering the sample and hold circuit 25 which is delivered by the control unit 18, and 27 denotes a power signal sampled and held. The other main components of the radio transmitter according to this embodiment are the same as those of the radio transmitter according to the first embodiment shown in FIG. 1, and therefore the description about the components will be omitted hereinafter.

Generally, for transmission of digital signals there is provided a roll-off filer, which serves as a low-pass filter, in a transmission line, in accordance with Nyquist theorem, in order to restrict the signal band while avoiding the inter-symbol interference. Hereinafter, a description will be made on the assumption that such a roll-off filter is provided in a transmission system wherein the radio transmitter according to the present invention can be used.

A variation in the power signal 8, which is detected by the detector 7, due to the modulation is the smallest at Nyquist points, i.e., at points where the signal is not modulated with any symbol and which are discrete points the intervals of which are defined by the reciprocal of the data transmission rate R (bits/second) of symbols. If 100% of the roll-off process can be carried out on the transmitter side, that is, only the transmitter system performs the function of the roll-off filter, the amplitude of the detection signal is insensitive to the modulation and therefore the detection signal has the same amplitude at all Nyquist points, as shown in FIG. 15a, because there is no inter-symbol interference. Accordingly, if the detection signal is sampled at Nyquist points, sampled values having no variations due to the modulation can be obtained. However, for example, in a transmission system which complies North America requirements, the transmitter and receiver sides share the function of the roll-off filter function half and half: the whole function of the roll-off filter is implemented by the product of the transmitter-side roll-off filter function and the receiver-side roll-off filter function. In the case of such a route-divided roll-off, since there also exists inter-symbol interference at Nyquist points, there is a possibility that variations in the detection signal due to the modulation cannot be eliminated by only sampling and holding the detection signal at Nyquist points, as shown in FIG. 15b.

In the case where in order to eliminate such variations, for example, the sampling timing is adjusted so that the detecting signal 8 is sampled at Nyquist points, it is preferable to connect a simple low-pass filter (not shown in FIG. 14) to the output of the sample and hold circuit, and alternatively to average the power data, i.e., the value of the output of the A/D converter which is captured by the control unit 18. On the other hand, in the case where the control unit generates the sampling timing signal 26 which causes a baseband signal having an identical amplitude (in this case, the detection signal is sampled at irregular intervals, for example, at different intervals Ta, Tb, Tc, and Td, . . . , as shown in FIG. 16, unlike the case where the detection signal is sampled at Nyquist points), the power data 27 are unaffected by variations in the detection signal.

Like the radio transmitter according to the first embodiment, after the A/D converter converts the output signal 27 from the sample and hold circuit into a digital signal, it delivers the digital signal to the control unit. The method of generating the control signal 14 and the operation of the system are the same as those in the first embodiment.

As previously explained, since the radio transmitter according to the fourth embodiment of the present invention is adapted to eliminate variations included in the detection signal 8 due to the modulation by means of the sample and hold circuit 25, the radio transmitter does not need software processing for eliminating the variations. Another advantage is that the hardware of the radio transmitter can be simplified. Furthermore, the embodiment offers the advantage of being able to provide the APC with high accuracy because error data and control data are generated through digital processing in the control unit 18.

Figure 17:
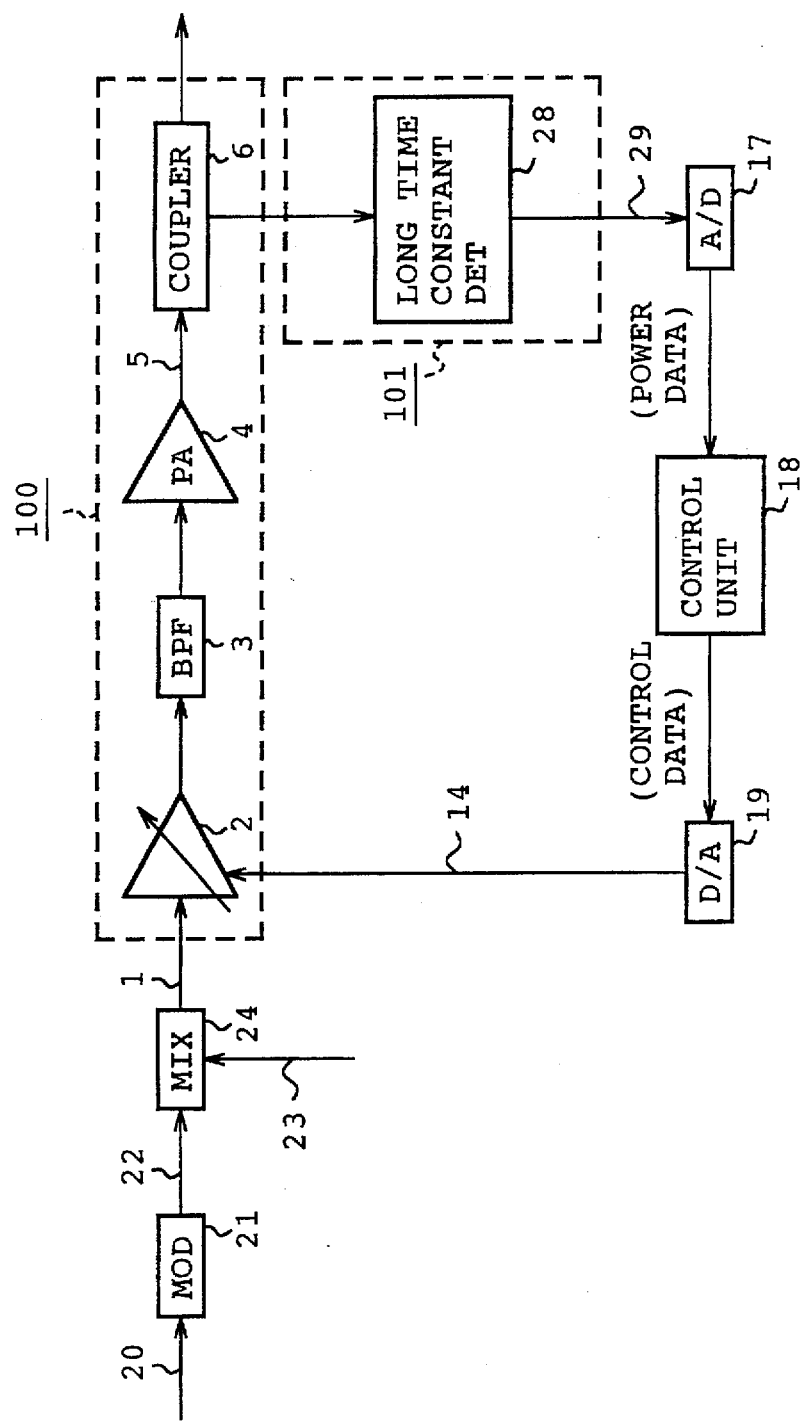
FIG. 17 is a block diagram of a radio transmitter according to a fifth embodiment of the present invention.

Referring now to FIG. 17, it illustrates a block diagram of a radio transmitter according to a fifth embodiment of the present invention. The radio transmitter of this embodiment differs from the radio transmitter of the first embodiment shown in FIG. 1 in that the second output of the coupler 6 is connected to a detector 28 having a longer time constant. The time constant of the detector 28 is sufficiently long as compared with the symbol rate of the system. The detector 28 combines the functions of the detector 7 and integrator 15 shown in FIG. 1. The time constant of the detector 28 is set in the same manner as the time constant of the integrator shown in FIG. 1. In FIG. 17, reference numeral 29 denotes an output signal from the detector 28. Since the operation of the control unit is the same as that of the control unit of the first embodiment, the description about the operation will be omitted hereinafter.

As previously explained, since the radio transmitter according to the fifth embodiment of the present invention is adapted to eliminate variations included in the detection signal 8 due to the modulation by means of the detector having a long time constant, the radio transmitter does not need software processing for eliminating the variations. Another advantage is that the hardware of the radio transmitter can be simplified. Furthermore, the embodiment offers the advantage of being able to provide the APC with high accuracy because error data and control data are generated through digital processing in the control unit 18. In addition, the embodiment offers the advantage in that it does not need the integrator 15.

Figure 18:
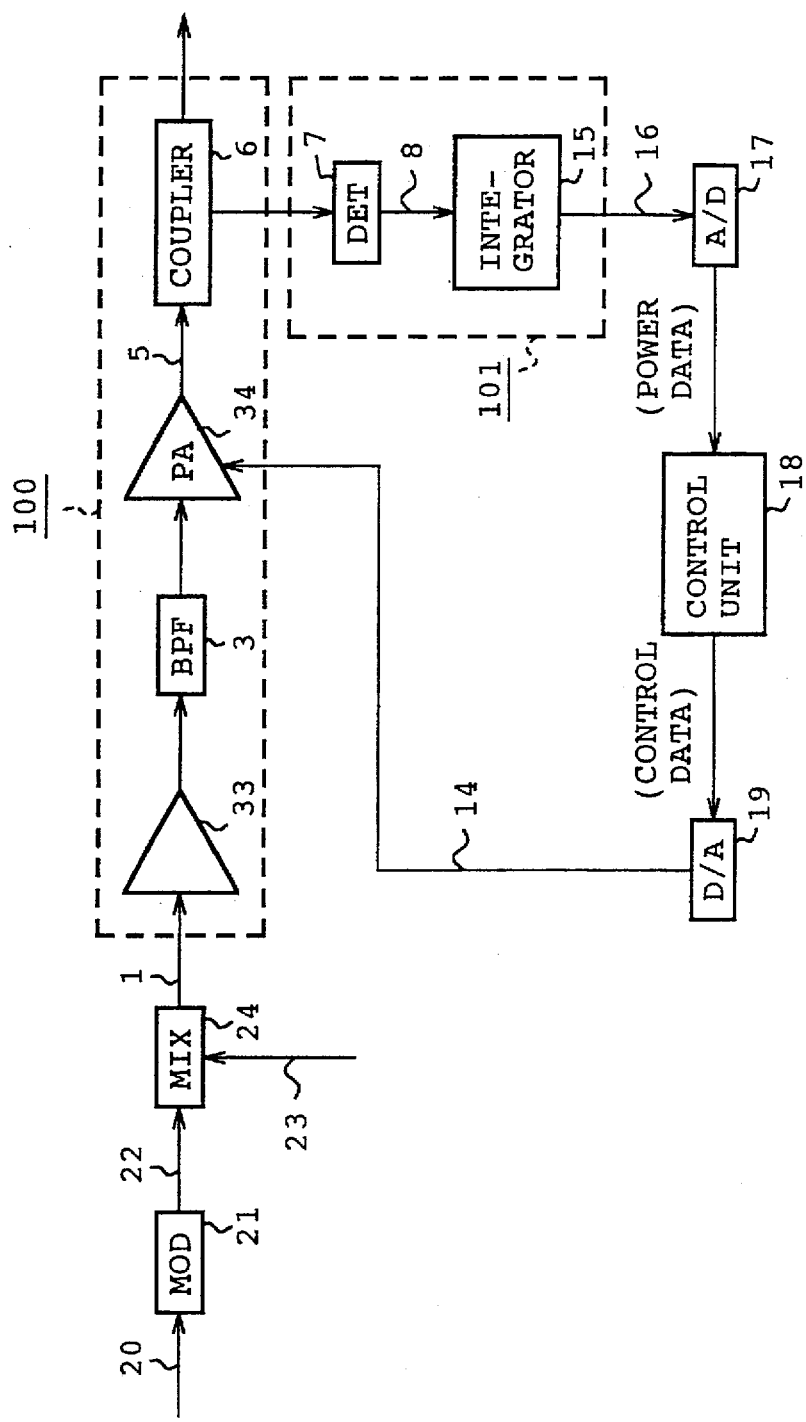
FIG. 18 is a block diagram of a radio transmitter according to a sixth embodiment of the present invention.

Referring now to FIG. 18, it illustrates a block diagram of a radio transmitter according to a sixth embodiment of the present invention. Although the radio transmitter according to this preferred embodiment operates similarly to the radio transmitter of the aforementioned embodiment shown in FIG. 1, the destination of the feedback control signal 14 in this embodiment is different from that of the feedback control signal 14 in the first embodiment. Either one of the aforementioned embodiments of the present invention assumes that the detection signal which represents the envelope of the RF output signal includes variations due to modulation such as the π/4-shift QPSK modulation and hence the system needs linear amplification. On the contrary, it is a main object of this embodiment to provide a radio transmitter which can conform to a modulation method that does not cause variations in the envelope of the RF output signal, such as frequency modulation (FM), or GMSK modulation which can be applied to the GSM system that conforms to a pan-European standard, i.e., constant envelope modulation.

In general, the use of a linear power amplifier within equipment using such constant envelope modulation is improper from the viewpoint of efficiency. In particular, in the case of an analog system using frequency modulation, since transmission is carried out continuously during each of transmission time periods, unlike the above-mentioned TDMA system, heat generation in a linear power amplifier or a deleterious effect on the calling time or the like cannot be avoided. In order to overcome the disadvantage, the radio transmitter according to this embodiment is provided with a pre-amplifier 33 instead of the variable gain element 2 as shown in FIG. 1, and an analog FM type power amplifier 34 with low saturated power characteristic instead of the linear power amplifier 4 as shown in FIG. 1. The radio transmitter can control the magnitude of the RF output signal by varying the value of the control signal in order to control the gain of the analog FM type power amplifier 34.

Although the radio transmitter of this embodiment comprises the integrator 15 as shown in FIG. 18, it does not necessarily require such the integrator because, in the case of the constant envelope modulation system, the detection signal 8 of the RF output signal 5 delivered by the detector 7 includes no variations due to the modulation and is thus constant. The operation of the other components of the radio transmitter of this embodiment is the same as the radio transmitter of the first embodiment shown in FIG. 1. Therefore, the description about the operation will be omitted hereinafter. A variant may be made in the exemplary embodiment shown. Instead of controlling the gain of the analog FM type power amplifier 34, the radio transmitter can alternatively control the gain of a variable gain element which can be disposed instead of the pre-amplifier 33.

As previously explained, since the radio transmitter according to the sixth embodiment of the present invention is adapted to eliminate variations included in the detection signal 8 due to the constant envelope modulation by means of the integrator, the radio transmitter does not need software processing for eliminating the variations. Another advantage is that the hardware of the radio transmitter can be simplified. Furthermore, the embodiment offers the advantage of being able to provide the APC with high accuracy because error data and control data are generated through digital processing in the control unit 18.

Figure 19:
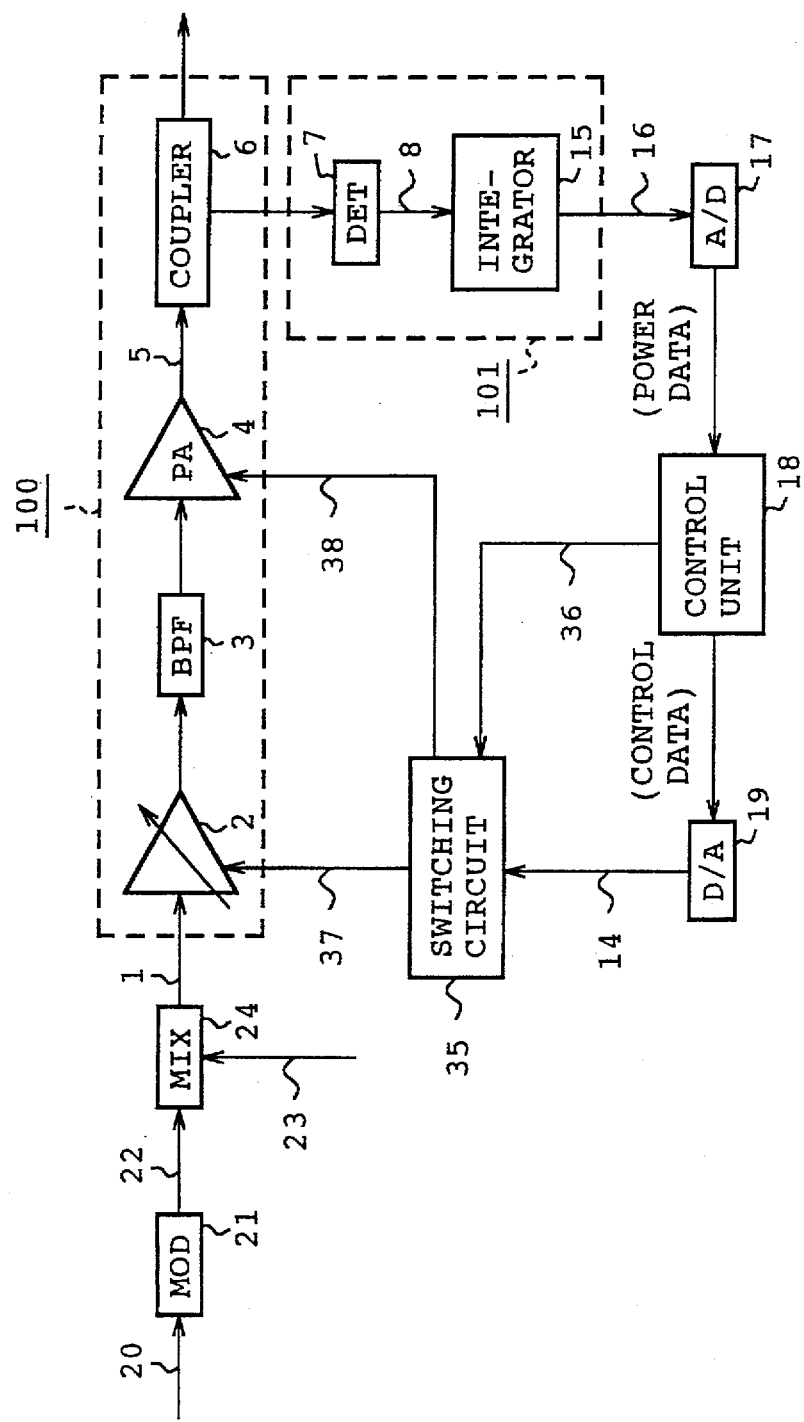
FIG. 19 is a block diagram of a radio transmitter according to a seventh embodiment of the present invention.

Referring next to FIG. 19, there is illustrated a block diagram of a radio transmitter according to a seventh embodiment of the present invention, which can select the destination of the feedback control signal 14 from among the variable gain control 2 and the linear power amplifier 4 by means of a switch circuit.

According to the IS-54 standard of EIA/TIA to which the above-mentioned North American digital cellular system conforms, it is required that radio transmitters can be used in the AMPS system which is the analog system that has been utilized mainly in North America. That is, radio transmitters are needed to be ready for a dual mode system in which analog mode and digital mode are mixed. According to the IS-54 standard, in analog mode, the frequency modulation is used in order for radio transmitters to conform to the conventional AMPS system, and, in digital mode, the π/4-shift QPSK modulation is used as previously mentioned.

The radio transmitter according to this embodiment is adapted to be able to be ready for such a dual mode system. In FIG. 19, reference numeral 35 denotes a switch circuit for changing the destination of the feedback control signal 14, 36 denotes a control signal which switches the switch circuit according to whether the system is in analog mode or digital mode, 37 denotes a control signal which has passed through the switch circuit 35 in digital mode, and 38 denotes a control signal which has passed through the switch circuit 35 in analog mode.

Since a method of generating the control signal 14 of this embodiment is the same as that of the first embodiment shown in FIG. 1, the description about the method will be omitted hereinafter. In digital mode, the radio transmitter carries out linear amplification which does not cause distortion to the transmission waveform by controlling the gain of the variable gain element 2 using the control signal 37. On the other hand, in analog mode, the radio transmitter controls the power of the RF output signal 5, i.e. the transmission power, by controlling for example the drain voltage or gate voltage of the linear power amplifier 4 using the control signal 38. Accordingly, in analog mode, the operating point of the linear power amplifier 4 is varied due to a change in the bias voltage of the linear power amplifier 4. Thereby, the efficiency of the radio transmitter can be improved. In this embodiment, each of the variety of memory tables mentioned above needs two types of data tables for the analog and digital modes, because the radio transmitter has to support the dual modes.

As previously mentioned, the radio transmitter according to the embodiment can change the target device to be controlled by using the control signal according to whether analog mode or digital mode is selected. Therefore, the embodiment offers the advantage of being able to provide optimal gain control suitable for each of the dual modes.

Figure 20:
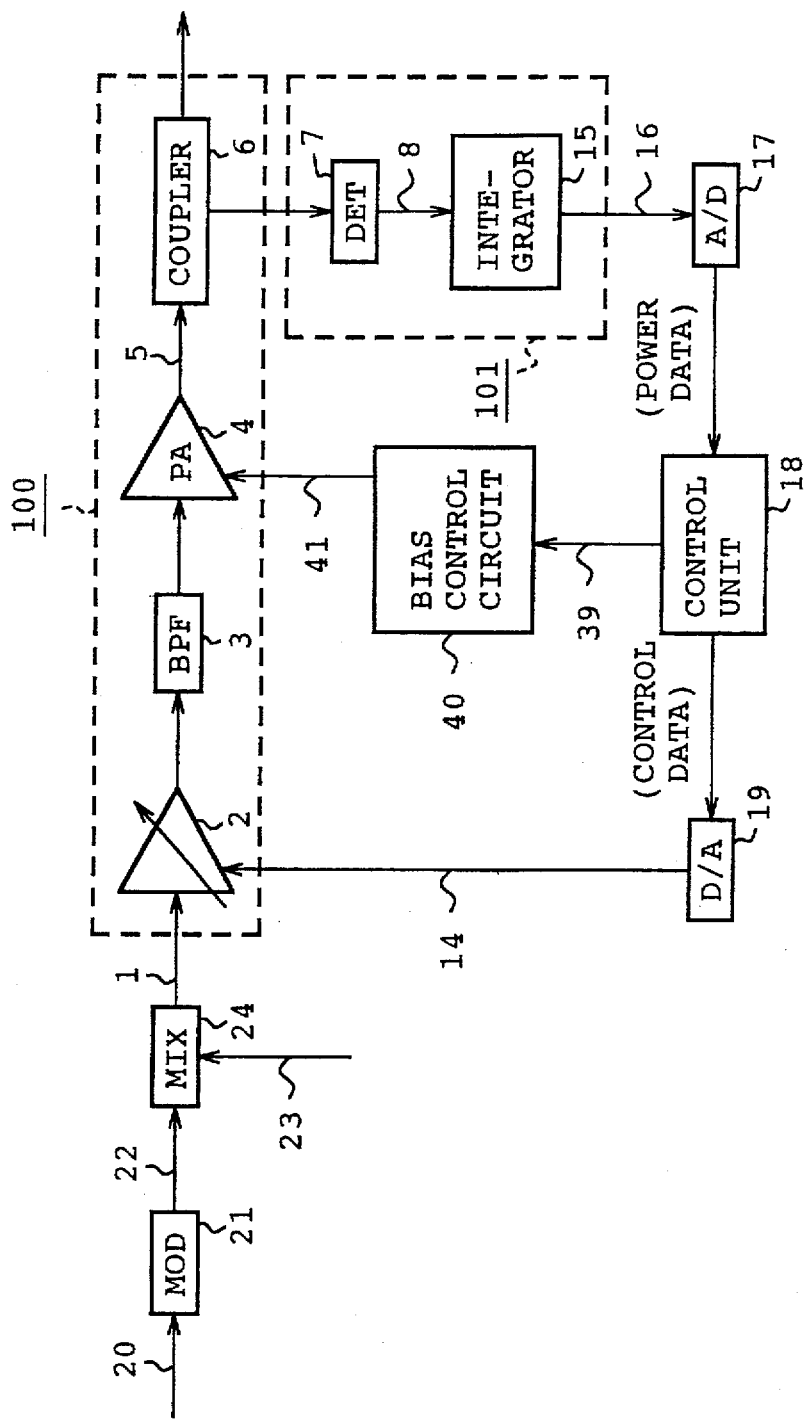
FIG. 20 is a block diagram of a radio transmitter according to an eighth embodiment of the present invention.

Referring now to FIG. 20, it illustrates a block diagram of a radio transmitter according to an eighth embodiment of the present invention. The radio transmitter according to this embodiment differs from the radio transmitter according to the seventh embodiment shown in FIG. 19 in that the control signal 14 can be returned to only the variable gain element 2. In FIG. 20, reference numeral 39 denotes a bias control signal output by the control unit 18, 40 denotes a bias control circuit for controlling a bias voltage which is applied to the linear power amplifier 4, and 41 denotes the bias voltage.

Since a method of generating the control signal 14 of this embodiment is the same as that of the first embodiment shown in FIG. 1, the description about the method will be omitted hereinafter. In accordance with the present embodiment, in analog mode that does not need the linear amplifier, the radio transmitter also controls the power of the RF output signal 5, i.e. the transmission power, by controlling the gain of the variable gain element 2, like in digital mode that needs the linear amplification. Furthermore, in analog mode, setting the bias voltage 41 generated by the bias control circuit 49 under the control of the bias control signal 39 to a proper value varies the operating point of the linear power amplifier 4. Thereby, the efficiency of the radio transmitter can be improved.

It is well known that a terminal (e.g. a portable phone) used for mobile communications such as a cellular system has a plurality of defined transmission power levels, one of which can be selected according to an instruction delivered thereto from a base station. In such a case, there is a possibility that the linear power amplifier 4 wastes its power if a low transmission power level is selected even in digital mode. In order to overcome the disadvantage, the radio transmitter according to this embodiment is adapted to set the bias voltage 41 generated by the bias control circuit 40 under the control of the bias control signal 39 to a proper value according to a power level selected from among the predetermined power levels so as to vary the operating point of the linear power amplifier 4 even in digital mode. As a result, the efficiency of the radio transmitter can be improved. Bias data which define the value of the bias control signal 39 for various use modes and power levels are recorded on the shared data memory table in the control unit 18. Proper bias data can be selected from the shared data memory table according to use mode and power level and used so as to keep the linear power amplifier 4 in an optimal state.

As previously mentioned, the radio transmitter according to the embodiment can be applied to a dual mode system including the digital and analog modes and change the bias voltage to be applied to the linear power amplifier according to which mode is selected and which power level is selected for transmission. Therefore, the embodiment offers the advantage of being able to provide optimal gain control suitable for each of the dual modes and each of the power levels.

As mentioned above, indirect modulation by which an IF band signal is modulated can be performed by the radio transmitter according to the present invention. It is needless to say that the radio transmitter according to the present invention can alteratively perform direct modulation by which an RF band signal is modulated.

As previously mentioned, the present invention offers the following advantages.

In accordance with a preferred embodiment of the present invention, the function of generating the control signal from the power signal representing the average power level of the RF output signal is implemented via digital processing. Therefore, the embodiment provides the advantage of being able to implement low-cost APC circuitry having an extremely simple structure. Furthermore, the embodiment offers the advantage of being able to implement versatile APC circuitry.

In accordance with another preferred embodiment of the present invention, an integrator is provided for generating the power signal from the detection signal obtained from the RF output signal. Therefore, the embodiment offers the advantages in that software processing for eliminating variations included in the detection signal is not needed, and the hardware can be simplified.

In accordance with another preferred embodiment of the present invention, there is provided a radio transmitter which can change the destination of the feedback control signal according to the type of modulation method. Therefore, the radio transmitter which can be applied to a system using two or more modulation methods, characteristics of which are different from each other, can be constructed by low-cost simple circuitry including a power amplifier and an APC circuit.

In accordance with another preferred embodiment of the present invention, there is provided a radio transmitter which can set the bias voltage of the linear power amplifier for amplifying the RF signal applied thereto to a proper value. Therefore, the radio transmitter can be applied to a system using two or more modulation methods, characteristics of which are different from each other, and can be constructed by low-cost simple circuitry including a power amplifier and an APC circuit.

In accordance with another preferred embodiment of the present invention, a sample and hold circuit is provided for generating the power signal from the detection signal. Therefore, the embodiment offers the advantages in that software processing for eliminating variations included in the detection signal is not needed, and the hardware can be simplified.

In accordance with another preferred embodiment of the present invention, the radio transmitter can record power data and control data on a power data recording unit and a control data recording unit, respectively, and then utilize such previous power data and control data recorded on the recording units so as to adjust the value of the control signal. Therefore, a process of calculating correction data and control data is omitted and the process of updating the control signal is simplified.

In accordance with another preferred embodiment of the present invention, the control unit includes means for correcting the power data applied thereto. Therefore, the embodiment offers the advantage of being able to generate the high accurate control signal and improve the accuracy of the APC.

In accordance with another preferred embodiment of the present invention, the function of generating the control signal from the power signal representing the average power level of the RF output signal is implemented via digital processing. Therefore, the embodiment provides the advantage of being able to implement low-cost APC circuitry having an extremely simple structure. Furthermore, the embodiment offers the advantage of being able to implement versatile APC circuitry.

Many widely different embodiments of the present invention may be constructed without departing from the spirit and scope of the present invention. It should be understood that the present invention is not limited to the specific embodiments described in the specification, except as defined in the appended claims.

What is claimed is:

1. A radio transmitter comprising:
   a transmission power control means for controlling a gain thereof according to a control signal applied thereto and for amplifying a radio frequency (RF) signal input thereto to generate an RF output signal having a predetermined power;
   a power monitoring means for monitoring the RF output signal so as to obtain an average power level of the RF output signal;

an error calculating means for calculating an error level from the difference between the average power level and a reference power level which corresponds to the predetermined power; and a control signal generating means for multiplying the error level by a correction coefficient so as to obtain a control signal correction value for correcting the value of the control signal, and adjusting the value of the control signal to be delivered to said transmission power control means on the basis of the control signal correction value and a reference control value that is predetermined so as to generate an RF output signal having the predetermined power.

2. The radio transmitter according to claim 1, wherein said transmission power control means includes a variable gain element for adjusting the power of the RF signal by means of gain control, and a linear amplifier for linearly amplifying the RF signal adjusted by said variable gain element to furnish the RF output signal having the predetermined power, and wherein said power monitoring means includes a detector for detecting an envelope from the RF output signal to furnish a detection signal, and an integrator for eliminating variations in the amplitude of the detection signal to furnish the average power level of the RF output signal.

3. The radio transmitter according to claim 2, wherein said variable gain element varies a gain thereof according to the value of the control signal applied thereto.

4. The radio transmitter according to claim 3, wherein said linear amplifier varies an operating point thereof according to the value of the control signal applied thereto, and wherein said radio transmitter further comprises a switching means for setting the destination of the control signal to said variable gain element in digital mode and setting the destination of the control signal to said linear amplifier in analog mode.

5. The radio transmitter according to claim 3, further comprising a bias control means for applying a bias voltage to said linear amplifier, and wherein said control signal generating means delivers a bias control signal having a value related to the value of the bias voltage to said bias control means.

6. The radio transmitter according to claim 1, wherein said transmission power control means includes a variable gain element for adjusting the power of the RF signal by means of gain control, and a linear amplifier for linearly amplifying the RF signal adjusted by said variable gain element to furnish the RF output signal having the predetermined power, and wherein said power monitoring means includes a detector for detecting an envelope from the RF output signal to furnish a detection signal, and a sample and hold circuit for sampling the detection signal at predetermined intervals to furnish the average power level of the RF output signal.

7. The radio transmitter according to claim 6, wherein said variable gain element varies a gain thereof according to the value of the control signal applied thereto.

8. The radio transmitter according to claim 7, wherein said linear amplifier varies an operating point thereof according to the value of the control signal applied thereto, and wherein said radio transmitter further comprises a switching means for setting the destination of the control signal to said variable gain element in digital mode and setting the destination of the control signal to said linear amplifier in analog mode.

9. The radio transmitter according to claim 7, further comprising a bias control means for applying a bias voltage to said linear amplifier, and wherein said control signal generating means delivers a bias control signal having a value related to the value of the bias voltage to said bias control means.

10. The radio transmitter according to claim 1, wherein said error calculating means includes a power data recording means for recording power data representing a current average power level of the RF output signal applied thereto so as to use the power data as the reference power level in a later calculation of the error level, and said control signal generating means includes a control data recording means for recording data representing a current value of the control signal so as to adjust the value of the control signal according to the data recorded if necessary in a later generation of the control signal.

11. The radio transmitter according to claim 1, wherein said error calculating means includes a means for correcting the average power level of the RF output signal obtained by said power monitoring means.

12. The radio transmitter according to claim 11, wherein said correcting means makes a temperature correction to the average power level in consideration of an ambient temperature, and said correcting means makes a channel correction to the average power level in consideration of the frequency of the RF output signal, i.e. a channel number used for transmitting the RF output signal.

13. A method of controlling transmission of a radio transmitter, comprising steps of:

generating a radio frequency (RF) output signal having a predetermined power from a radio frequency (RF) signal according to the value of a control signal by means of a gain control;

monitoring the RF output signal so as to obtain an average power level of the RF output signal;

calculating an error level from the difference between the average power level and reference power data which corresponds to the predetermined power of the RF output signal;

calculating error data by multiplying the error level by coefficient data so as to correct the value of the control signal; and adjusting the value of the control signal on the basis of the error data and reference control data that is predetermined so as to generate an RF output signal having the predetermined power.

14. The method according to claim 13, wherein a table is provided for storing a plurality of data sets each including reference power data, coefficient data, and reference control data which are predetermined with respect to a plurality of parameters defining transmission conditions of the radio transmitter.

15. The method according to claim 14, wherein the parameters include a system mode parameter, a channel band parameter, and a transmit power level parameter.

* * * * *